(12) United States Patent
Maeda et al.

(10) Patent No.: US 7,952,916 B2
(45) Date of Patent: May 31, 2011

(54) RESISTANCE-CHANGE MEMORY

(75) Inventors: Takashi Maeda, Yokohama (JP); Yoshihiro Ueda, Yokohama (JP); Kenji Tsuchida, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 141 days.

(21) Appl. No.: 12/366,396

(22) Filed: Feb. 5, 2009

(65) Prior Publication Data

US 2009/0201717 A1 Aug. 13, 2009

(30) Foreign Application Priority Data

Feb. 7, 2008 (JP) ................................. 2008-027925

(51) Int. Cl.
*G11C 11/00* (2006.01)
(52) U.S. Cl. ...................... 365/158; 365/207; 365/210.1; 365/230.03
(58) Field of Classification Search .................. 365/158, 365/209, 210.1, 230.3
See application file for complete search history.

(56) References Cited

U.S. PATENT DOCUMENTS

| | | | | |
|---|---|---|---|---|
| 2003/0103402 A1* | 6/2003 | Tran et al. | ...................... | 365/211 |
| 2006/0227598 A1* | 10/2006 | Sakimura et al. | ............. | 365/158 |
| 2007/0007536 A1* | 1/2007 | Hidaka | ............................ | 257/72 |
| 2007/0268733 A1* | 11/2007 | Ueda et al. | ....................... | 365/63 |
| 2009/0067212 A1* | 3/2009 | Shimizu | ........................ | 365/148 |

OTHER PUBLICATIONS

Mark Durlam, et al., "A 1-Mbit MRAM Based on 1T1MTJ Bit Cell Integrated With Copper Interconnects," IEEE Journal of Solid-state Circuits, vol. 35, No. 5, May 2003.

* cited by examiner

*Primary Examiner* — Hoai V Ho
(74) *Attorney, Agent, or Firm* — Knobbe, Martens, Olson & Bear LLP

(57) ABSTRACT

A resistance-change memory includes first and second bit lines running in the same direction, a third bit line running parallel to the first and second bit lines, fourth and fifth bit lines running in the same direction, a sixth bit line running parallel to the fourth and fifth bit lines, a first memory element which has one and the other terminals connected to the first and third bit lines, and changes to one of first and second resistance states, a first reference element having one and the other terminals connected to the fourth and sixth bit lines, and set in the first resistance state, a second reference element having one and the other terminals connected to the fifth and sixth bit lines, and set in the second resistance state, and a sense amplifier having first and second input terminals connected to the first and fourth bit lines.

20 Claims, 19 Drawing Sheets

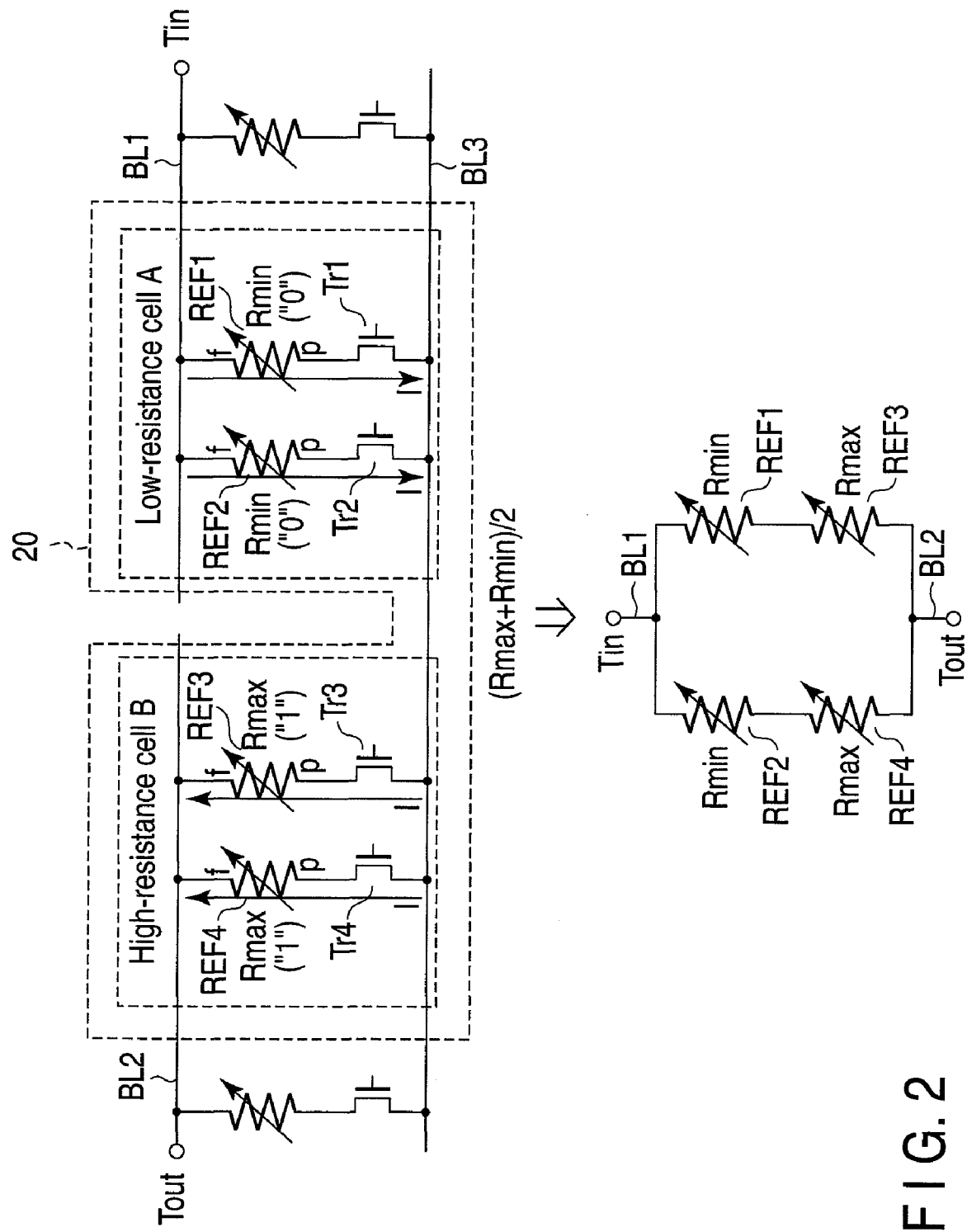
F I G. 2

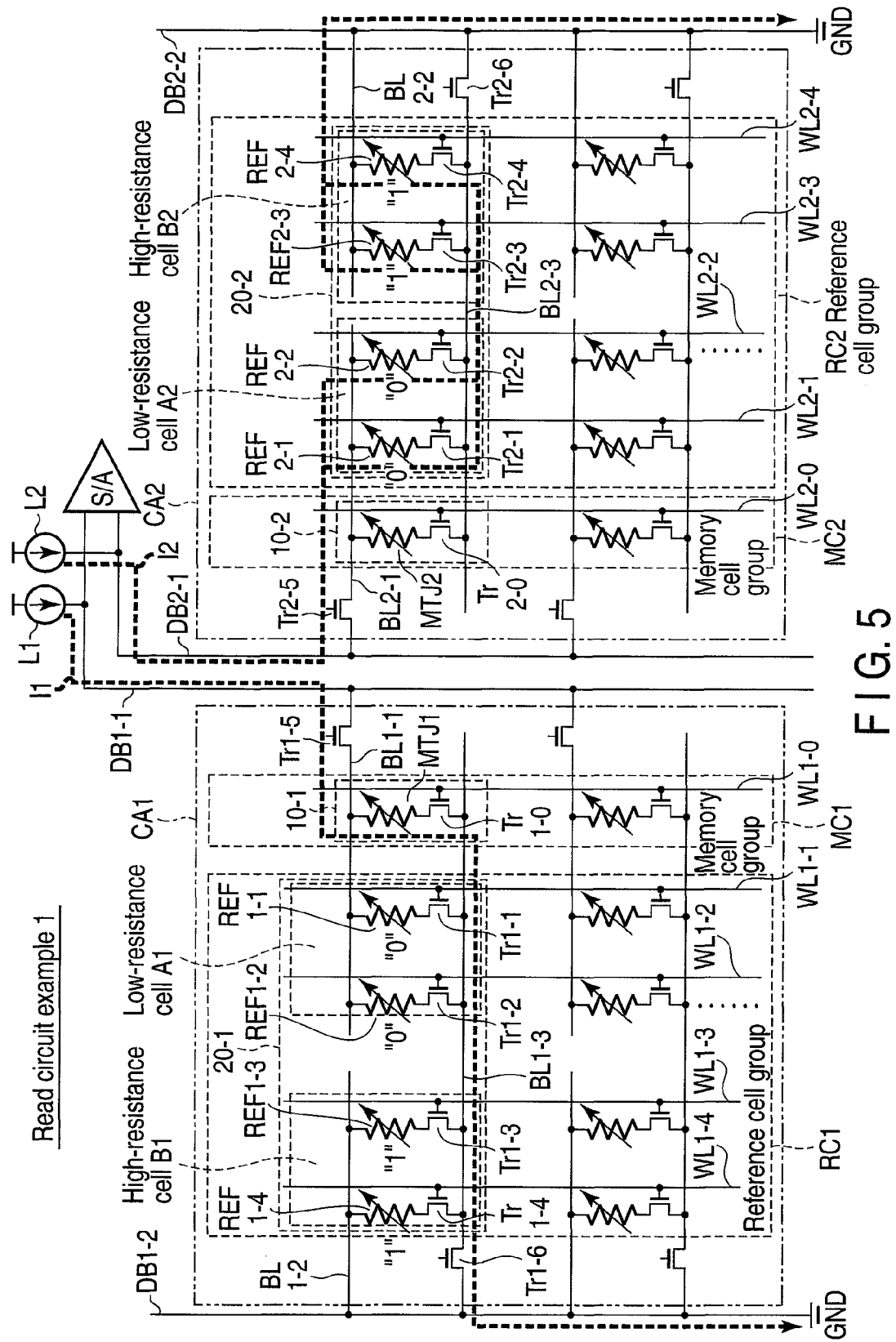
F I G. 5

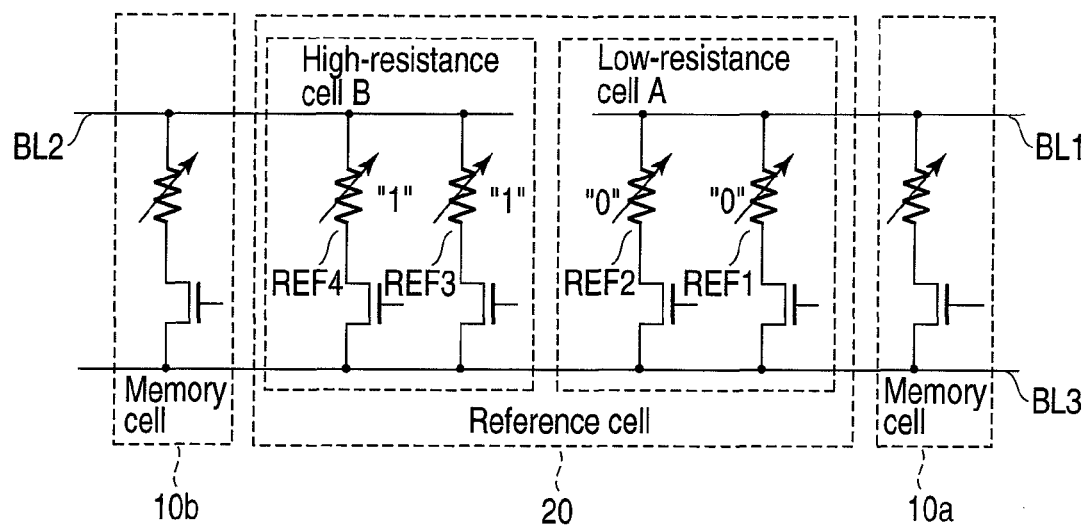
F I G. 17
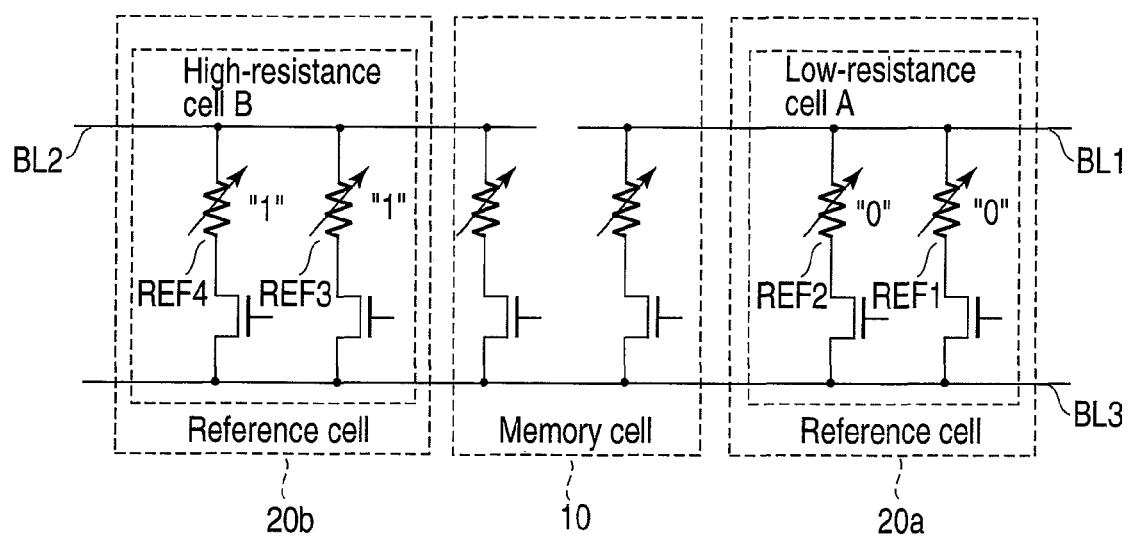
F I G. 18

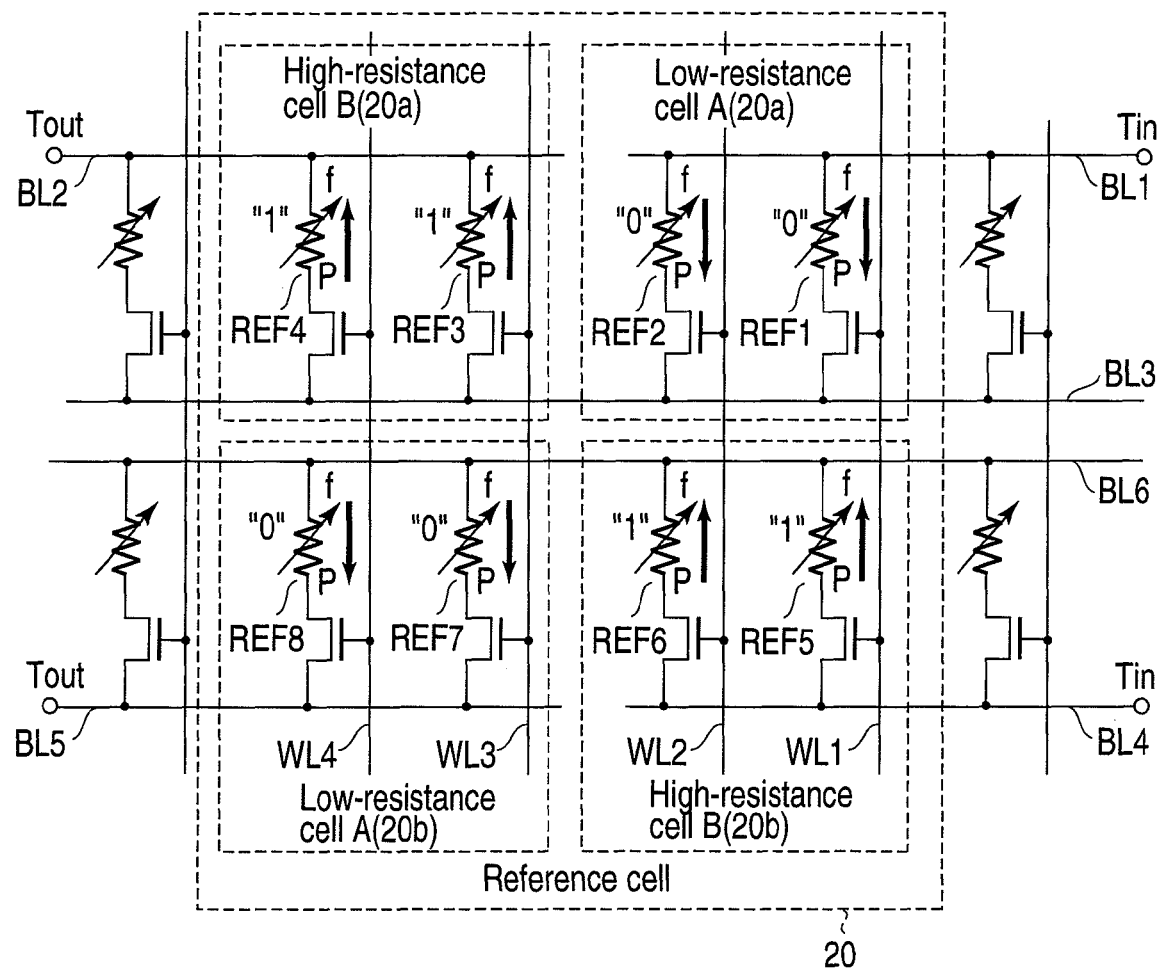
F I G. 21

US 7,952,916 B2

RESISTANCE-CHANGE MEMORY

CROSS-REFERENCE TO RELATED APPLICATIONS

This application is based upon and claims the benefit of priority from prior Japanese Patent Application No. 2008-027925, filed Feb. 7, 2008, the entire contents of which are incorporated herein by reference.

BACKGROUND OF THE INVENTION

1. Field of the Invention

The present invention relates to a resistance-change memory using a resistance-change memory element that discriminates between "0" and "1" data by the resistance change of the element and, more particularly, to a circuit used to read out a reference signal generated by a reference cell.

2. Description of the Related Art

Examples of a resistance-change element that stores data by using the resistance change of the element are an MRAM (Magnetic Random Access Memory), PRAM (Phase-change Random Access Memory), and ReRAM (Resistance Random Access Memory) (e.g., U.S. Pat. No. 7,105,870 and IEEE Journal of Solid-Static Circuits, Vol. 38, No. 5, May 2003, pp. 769-773). A resistance-change memory will be explained below by taking the MRAM as an example.

The MRAM is a memory device formed by an MTJ (Magnetic Tunnel Junction) element using the magneto resistive effect by which the resistance value changes in accordance with the magnetization direction. In particular, a large resistance change can be obtained by an MTJ element using the TMR (Tunneling Magneto Resistive) effect.

The conventional MRAM uses the induced magnetic field writing method that reverses the magnetization direction in a free layer by using an induced magnetic field generated by supplying an electric current through an interconnection running near the MTJ element. However, this method has the problem that a write current increases as micropatterning advances. This problem is serious when implementing a large-capacity memory.

As a new write method of solving this problem, the spin transfer torque writing method has been proposed (e.g., U.S. Pat. No. 5,695,864). The spin transfer torque writing method reverses the magnetization in a free layer by directly supplying an electric current to the MTJ element. The direction of the electric current determines the relative magnetization direction in the free layer with respect to a pinned layer. In this spin transfer torque writing method, the electric current for reversing the magnetization in the free layer decreases in proportion to the size of a cell, so the write current reduces as micropatterning advances. Accordingly, the spin transfer torque writing method is suitable for a large-capacity memory.

The MTJ element has a resistance value Rmin or Rmax (Rmax>Rmin) in accordance with whether the magnetization directions in the free layer and pinned layer are parallel or antiparallel. In the read operation of the MRAM, a read current is supplied to a read object cell, and the change in electric current or voltage corresponding to the resistance value of the element is compared with a reference signal and read out. The reference signal can be generated from an external circuit, or from reference cells in which "0" and "1" data are prewritten. Unfortunately, the method of generating the reference signal from an external circuit consumes an extra space and extra power. Therefore, it is preferable to use a portion of a memory cell array as the reference cell.

When reading out data from the MRAM by using the reference signal, the read margin can be maximized by using middle resistance Rmid=(Rmax+Rmin)/2. U.S. Pat. No. 6,392,923 achieves Rmid by combining a plurality of reference cells. More specifically, the middle resistance Rmid is obtained by connecting series circuits of Rmax and Rmin in parallel. Also, an MRAM is implemented by using the reference signal of this type (e.g., IEEE Journal of Solid-Static Circuits, Vol. 38, No. 5, May 2003, pp. 769-773).

Unfortunately, the read circuit of the conventional spin transfer torque writing type MRAM as described above has the following problems.

First, when the conventional reference signal generation method is applied to, e.g., the spin transfer torque writing MRAM, a reference cell having the resistance Rmax and that having the resistance Rmin must be connected in series. For this purpose, a special interconnection must be formed in only a reference cell portion of the memory cell array by using a dedicated reference cell formation process. In addition, series-connected reference cells are connected in parallel in order to achieve one reference signal. This requires two data rows and two data columns. Accordingly, the occupied area of the cell array increases.

Also, unlike in the induced magnetic field writing method described in U.S. Pat. No. 6,392,923, the spin transfer torque writing method has no means for writing different data in the two series-connected reference cells. In the stage of forming the reference cells, therefore, data corresponding to Rmax and Rmin must be prewritten in the reference cells. This decreases the degree of freedom of reference cell data setting.

Furthermore, in the spin transfer torque writing type MRAM, an electric current is supplied to the MTJ element in a read operation in the same manner as in a write operation. This increases the possibility of so-called read disturb by which a write error occurs during a read operation. Especially in the method of generating the reference potential from the reference cells in a read operation, the probability of the read disturb is highest because the reference cells are frequently accessed. That is, a read current is supplied to the reference cells in the same direction regardless of whether the data of each reference cell is "0" or "1". Therefore, the write current and read current flow through one reference cell in the same direction, and flow through the other reference cell in opposite directions. Accordingly, the read disturb readily occurs in the reference cell in which the latter data is written.

BRIEF SUMMARY OF THE INVENTION

A resistance-change memory according to an aspect of the present invention comprising a first bit line and a second bit line running in the same direction; a third bit line running parallel to the first bit line and the second bit line; a fourth bit line and a fifth bit line running in the same direction; a sixth bit line running parallel to the fourth bit line and the fifth bit line; a first memory element which has one terminal connected to the first bit line and the other terminal connected to the third bit line, and changes to one of a first resistance state and a second resistance state; a first reference element having one terminal connected to the fourth bit line and the other terminal connected to the sixth bit line, and set in the first resistance state; a second reference element making a pair with the first reference element, having one terminal connected to the fifth bit line and the other terminal connected to the sixth bit line, and set in the second resistance state; and a sense amplifier having a first input terminal connected to the first bit line and a second input terminal connected to the fourth bit line.

BRIEF DESCRIPTION OF THE SEVERAL VIEWS OF THE DRAWING

FIG. 2 is a schematic circuit diagram of a reference cell according to the embodiment of the present invention;

FIG. 5 is a schematic circuit diagram of read circuit example 1 of the magnetic random access memory according to the embodiment of the present invention;

FIG. 17 is a schematic view of layout example 1 of the reference cell in the bit line direction according to the embodiment of the present invention;

FIG. 18 is a schematic view of layout example 2 of the reference cells in the bit line direction according to the embodiment of the present invention;

FIG. 21 is a schematic view of layout example 2 in the word line direction of the reference cell according to the embodiment of the present invention.

DETAILED DESCRIPTION OF THE INVENTION

Figure 1:
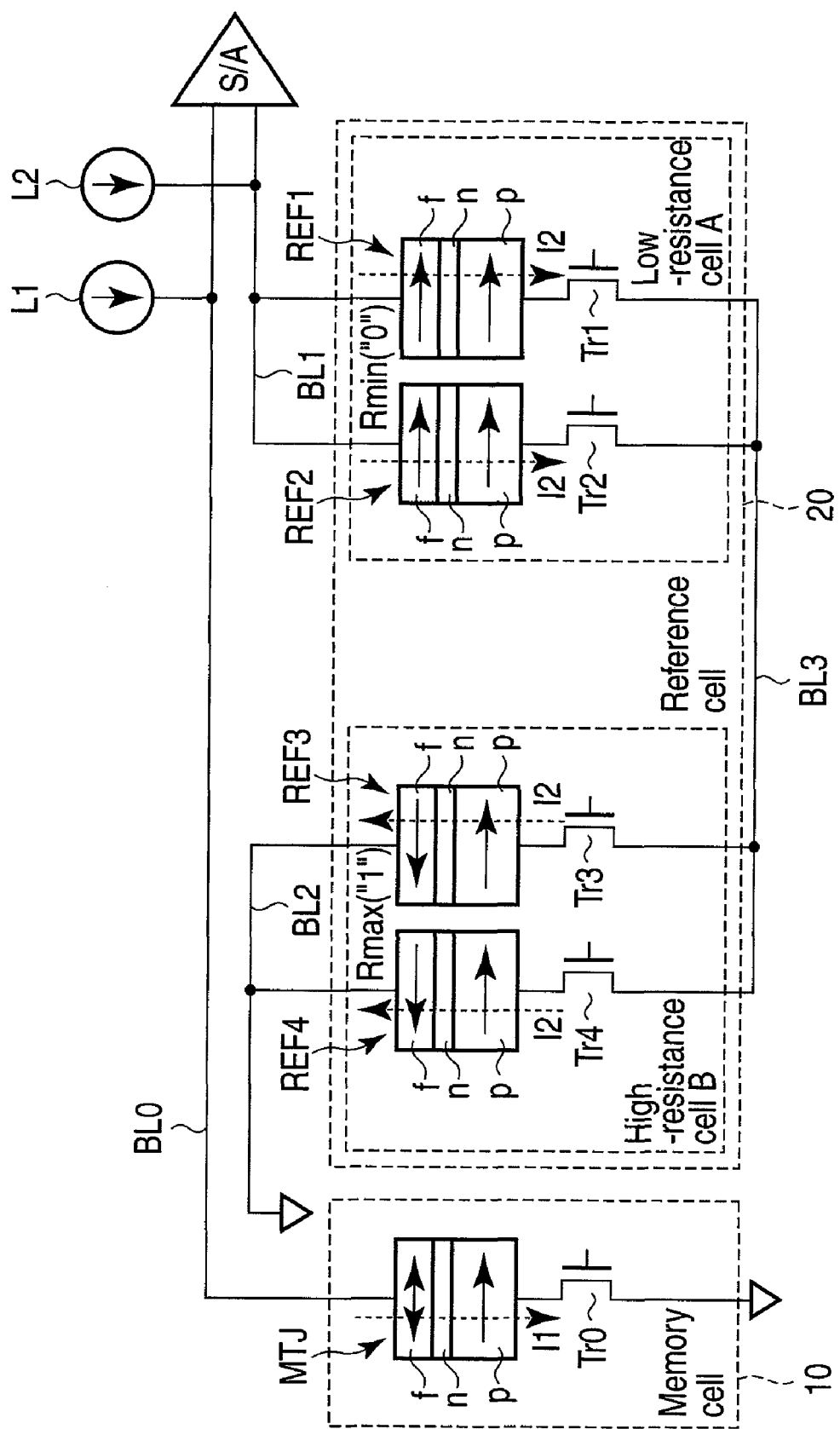
FIG. 1 is an exemplary view of a magnetic random access memory according to an embodiment of the present invention.

An embodiment of the present invention will be explained below with reference to the accompanying drawing. In the following explanation, the same reference numerals denote the same parts throughout the drawing.

[Outline]

FIG. 1 is an exemplary view of a magnetic random access memory according to the embodiment of the present invention. An outline of the magnetic random access memory according to the embodiment of the present invention will be explained below.

In this embodiment as shown in FIG. 1, to generate a reference signal for a read operation from a reference cell 20 in which "0" and "1" data are prewritten, a memory cell 10 is connected to the first input terminal of a sense amplifier S/A, and the reference cell 20 is connected to the second input terminal of the sense amplifier S/A.

The memory cell 10 has an MTJ element (magneto resistive element) MTJ and transistor Tr0. The MTJ element MTJ includes a pinned layer p in which the magnetization direction is fixed, a free layer f in which the magnetization direction changes in accordance with the direction of a write current, and a nonmagnetic layer n sandwiched between the pinned layer p and free layer f. The pinned layer p is connected to one end of the current path of the transistor Tr0, and the other end of the current path of the transistor Tr0 is connected to a ground terminal. The free layer f is connected to a bit line BL0, and a current source L1 is connected to the bit line BL0.

In the reference cell 20, a low-resistance cell A set in a low-resistance state Rmin and a high-resistance cell B set in a high-resistance state Rmax are paired and connected in series. The low-resistance cell A includes two cells connected in parallel, and the high-resistance cell B includes two cells connected in parallel. Accordingly, the reference cell 20 includes four cells in FIG. 1. However, each of the low-resistance cell A and high-resistance cell B need only have at least one cell, and may also have three or more cells. The reference cell 20 and memory cell 10 are structurally entirely the same, and the number of the reference cells 20 can be changed by only changing the number of word liens to be selected in a read operation. Therefore, the number of the reference cells 20 can be freely changed after the formation of the device. Various resistance values can be achieved as the synthetic resistance of the reference cell 20 by changing the number of the reference cells 20. Accordingly, a value other than a middle value may also be used as the reference signal by changing the number of the reference cells 20. For example, (Rmax+Rmin)/3 can be achieved as the synthetic resistance by using three low-resistance cells A and three high-resistance cells B. Note that when only the reference cells are connected to bit lines BL1-2 and BL2-2 as shown in, e.g., FIG. 5 (to be described later), the number of the reference cells is desirably determined before the formation.

Similar to the memory cell 10, each cell of the reference cell 20 includes an MTJ element and transistor connected in series. More specifically, one cell of the low-resistance cell A has a reference element REF1 and transistor Tr1. The other cell of the low-resistance cell A has a reference element REF2 and transistor Tr2. One cell of the high-resistance cell B has a reference element REF3 and transistor Tr3. The other cell of the high-resistance cell B has a reference element REF4 and transistor Tr4.

Each of the reference elements REF1, REF2, REF3, and REF4 is an MTJ element, and hence has a pinned layer p, a free layer f, and a nonmagnetic layer n sandwiched between the pinned layer p and free layer f. In the reference elements REF1 and REF2, the magnetization directions in the pinned layer p and free layer f are set parallel in order to obtain the low-resistance state Rmin. On the other hand, in the reference elements REF3 and REF4, the magnetization directions in the pinned layer p and tree layer f are set antiparallel in order to obtain the high-resistance state Rmax. Note that in this embodiment, the low-resistance state Rmin is data "0", and the high-resistance state Rmax is data "1".

The free layers f of the reference elements REF1 and REF2 are connected to the sense amplifier S/A via a bit line BL1. The free layers f of the reference elements REF3 and REF4 are connected to the ground terminal via a bit line BL2. Each of the pinned layers p of the reference elements REF1, REF2, REF3, and REF4 are connected to one end of the current path of a corresponding one of the transistors Tr1, Tr2, Tr3, and Tr4. The other end of the current path of each of the transistors Tr1, Tr2, Tr3, and Tr4 is connected to a bit line BL3. Accordingly, the low-resistance cell A and high-resistance cell B are connected in series via the bit line BL3.

In a read operation of this embodiment as described above, the reference cell 20 generates a reference signal when reading out the resistance state of the memory cell 10. In this read operation, a read current I2 flows in the same direction as that in a write operation through the reference elements REF1, REF2, REF3, and REF4 in which data "0" and "1" are written. That is, in spin transfer torque write, an electric current is supplied from the free layer f to the pinned layer p when writing data "0", and from the pinned layer p to the free layer f when writing data "1". In the read operation of this embodiment, the read current I2 is supplied in the same direction as the "0" write direction, i.e., from the free layer f to the pinned layer p in the reference elements REF1 and REF2 in which data "0" is set. On the other hand, the read current I2 is supplied in the same direction as the "1" write direction, i.e., from the pinned layer p to the free layer f in the reference elements REF3 and REF4 in which data "1" is set.

[2] Reference Cell

[2-1] Circuit Configuration

FIG. 2 is a schematic circuit diagram of the reference cell according to the embodiment of the present invention. The circuit configuration of the reference cell for achieving a middle resistance Rmid will be explained below together with the circuit configuration of the memory cell.

As shown in FIG. 2, two reference cells are connected to each of the bit lines BL1 and BL2. The two reference cells connected to the bit line BL1 are the low-resistance cells A set in the high-resistance state Rmin. The two reference cells connected to the bit line BL2 are the high-resistance cells B set in the high-resistance state Rmax.

An input terminal Tin is attached to one end of the bit line BL1. An output terminal Tout is attached to one end of the bit line BL2. Data corresponding to the first data (in this embodiment, "0") is written in the reference elements REF1 and REF2. Data corresponding to the second data (in this embodiment, "1") different from the first data is written in the reference elements REF3 and REF4. Only the four selection transistors Tr1, Tr2, Tr3, and Tr4 respectively connected in series with the four reference elements REF1, REF2, REF3, and REF4 are turned on (shorted), and selection transistors of other memory cells are turned off (opened). Consequently, middle resistance Rmid (Rmax+Rmin)/2 is generated between the input terminal Tin and output terminal Tout.

More specifically, the reference element REF1 in the low-resistance state Rmin and the reference element REF3 in the high-resistance state Rmax are connected in series, the reference element REF2 in the low-resistance state Rmin and the reference element REF4 in the high-resistance state Rmax are connected in series, and the two series circuits are connected in parallel. As a consequence, the overall resistance of the reference cell 20 is (Rmax+Rmin)/2. Therefore, the circuit configuration of the reference cell 20 of this embodiment can generate a middle resistance capable of ensuring the widest read margin as in the conventional device.

A read current I flows in the same direction as that of a "0"-write current through the reference elements REF1 and REF2 in which data "0" is written, and flows in the same direction as that of a "1"-write current through the reference elements REF3 and REF4 in which data "1" is written. This makes it possible to reduce the read disturb. Note that in this embodiment, the pinned layers p of the reference elements (MTJ elements) REF1, REF2, REF3, and REF4 are respectively connected to the selection transistors Tr1, Tr2, Tr3, and Tr4.

[2-2] Layout and Sectional Structure

Figure 3:
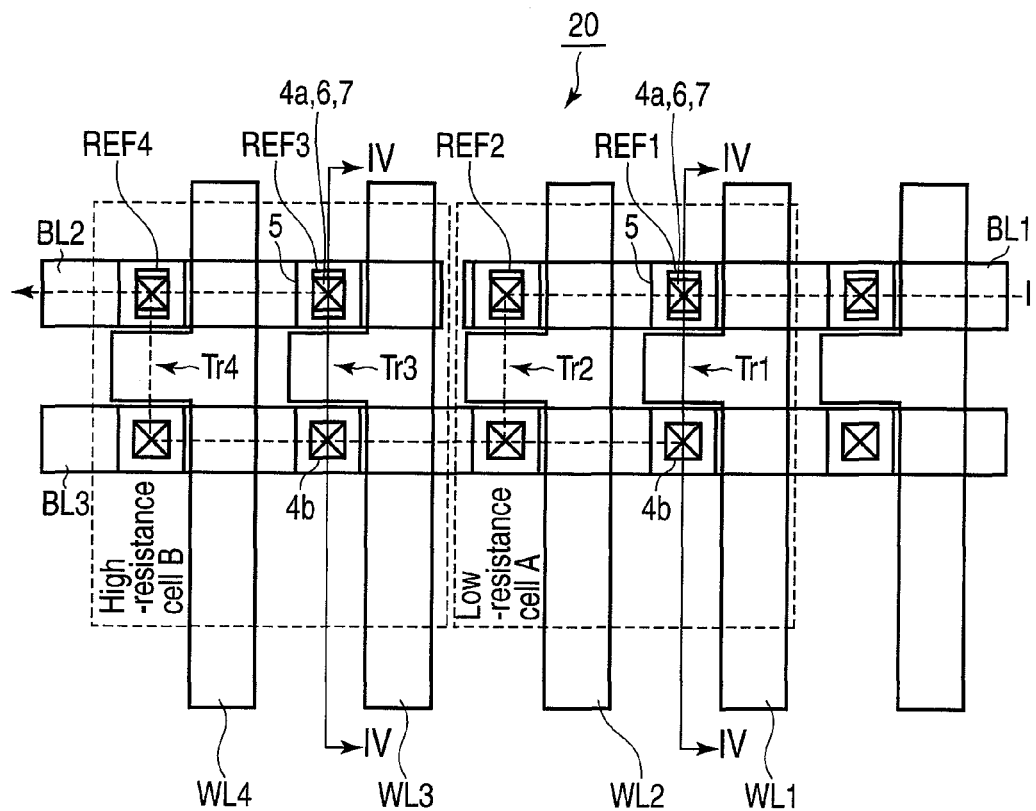
FIG. 3 is a view showing the layout of the reference cell of the magnetic random access memory according to the embodiment of the present invention.
Figure 4:
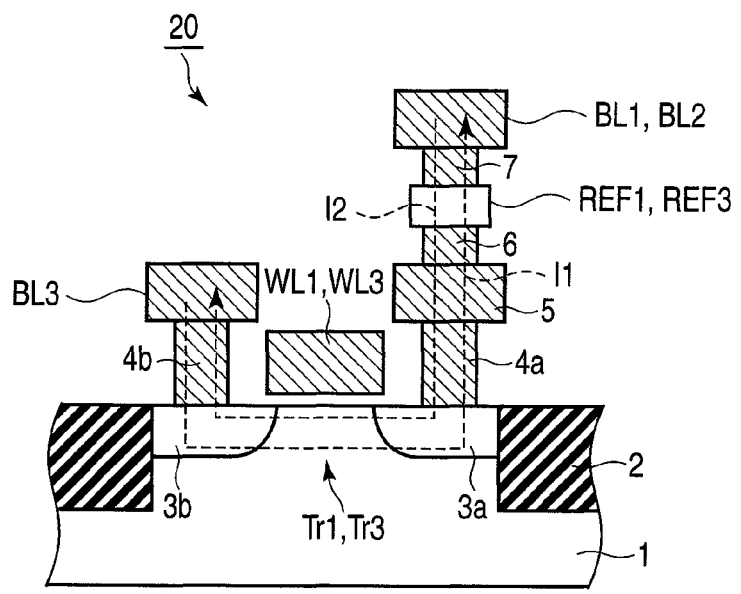
FIG. 4 is an exemplary sectional view of the reference cell taken along a line IV-IV in FIG. 3.

FIG. 3 is a view showing the layout of the reference cell of the magnetic random access memory according to the embodiment of the present invention. FIG. 4 is an exemplary sectional view of the reference cell taken along a line IV-IV in FIG. 3. The layout and sectional structure of the reference cell will be explained below.

As shown in FIG. 3, the three bit lines BL1, BL2, and BL3 run parallel in the same direction. The bit lines BL1 and BL2 run on the same straight line, and are separated from each other between the low-resistance cell A and high-resistance cell B. The reference elements REF1 and REF2 are arranged below the bit line BL1. The reference elements REF3 and REF4 are arranged below the bit line BL2.

Word lines WL1, WL2, WL3, and WL4 run to intersect the bit lines BL1, BL2, and BL3. The word lines WL1, WL2 WL3, and WL4 are respectively connected to the gates of the selection transistors Tr1, Tr2, Tr3, and Tr4. The word lines WL1, WL2, WL3, and WL4 have projections that project in the direction in which the bit lines BL1, BL2, and BL3 run. More specifically, the word line WL1 positioned beside the reference element REF1 has the projection between the bit lines BL1 and BL3, the word line WL2 positioned beside the reference element REF2 has the projection between the bit lines BL1 and BL3, the word line WL3 positioned beside the reference element REF3 has the projection between the bit lines BL2 and BL3, and the word line WL4 positioned beside the reference element REF4 has the projection between the bit lines BL2 and BL3.

In the reference cell 20 as shown in FIG. 4, the selection transistors Tr1 and Tr3 are formed on a semiconductor substrate 1. In the transistors Tr1 and Tr3, the word lines WL1 and WL3 functioning as gate electrodes are formed on the semiconductor substrate 1, and source/drain diffusion layers 3a and 3b are formed in the semiconductor substrate 1 on the sides of the word lines WL1 and WL3. Element isolation regions 2 having, e.g., the STI (Shallow Trench Isolation) structure separates the element regions of the semiconductor substrate 1.

The reference elements REF1 and REF3 are connected to the source/drain diffusion layer 3a via contacts 4a and 6 and an interconnection 5. The reference elements REF1 and REF3 are respectively connected to the bit lines BL1 and EL2 via a contact 7. The bit line BL3 is connected to the source/ drain diffusion layer 3b via a contact 4b. The bit lines BL1 and BL2 are formed in the same interconnection layer. The bit line BL3 is formed in an interconnection layer different from the bit lines BL1 and BL2 (an interconnection layer below the bit lines BL1 and BL2).

When the reference cell 20 generates a reference signal, as shown in FIG. 3, the read current I flows through the reference elements REF1, REF2, REF3, and REF4. Referring to the sectional view of FIG. 4, the read current flows in a direction I1 (upward on the drawing surface) in the reference elements REF1 and REF2 in which data "0" is written, and in a direction I2 (downward on the drawing surface) in the reference elements REF3 and REF4 in which data "1" is written. Accordingly, the direction of the read current flowing through the reference elements REF1 and REF2 is opposite to that of the read current flowing through the reference elements REF3 and REF4.

[3] Read Circuits

The read operation of this embodiment uses the tunneling magneto resistive effect. The tunneling magneto resistive effect is a phenomenon in which the resistance of the MTJ element changes in accordance with the relative relationship (parallel/antiparallel) between the two magnetization directions in the pinned layer p and free layer f. More specifically, an electric current readily flows through an insulating layer (the resistance decreases) when the magnetization in the free layer f is parallel to that in the pinned layer p, and hardly flows (the resistance increases) when the former is antiparallel to the latter. The state in which the magnetization direction in the free layer f is parallel or antiparallel to that in the pinned layer p is made to correspond to "0" or "1". This makes it possible to fabricate a memory element from which written data can be read by reading the resistance state of the MTJ element.

In this embodiment, the resistance value of the MTJ element of a read object cell is determined by using the reference signal generated by the reference cell. Practical examples of a read circuit for generating the reference signal will be explained below.

[3-1] Read Circuit Example 1

FIG. 5 is a schematic circuit diagram of read circuit example 1 of the magnetic random access memory according to the embodiment of the present invention. The circuit configuration of read circuit example 1 of this embodiment will be explained below together with the circuit configuration of the memory cell.

As shown in FIG. 5, cell arrays CA1 and CA2 are formed by arranging a plurality of cells in a matrix. In this embodiment, four reference cells must be selected for one read object cell, so the two cell arrays CA1 and CA2 are thus prepared.

The cell array CA1 is connected to the first input terminal of a sense amplifier S/A via a data bus DB1-1. The cell array CA2 is connected to the second input terminal of the sense amplifier S/A via a data bus DB2-1. Details of the cell arrays CA1 and CA2 will be explained blow by taking the cell array CA1 as an example. Note that the arrangement of the cell array CA2 is the same as that of the cell array CA1, so a repetitive explanation will be omitted.

The cell array CA1 includes a memory cell group MC1 and reference cell group RC1. A memory cell 10-1 in the memory cell group MC1 has an MTJ element MTJ1 and transistor Tr1-0. A reference cell 20-1 in the reference cell group RC1 is formed by pairing a low-resistance cell A1 set in data "0" (the low-resistance state Rmin) and a high-resistance cell B1 set in data "1" (the high-resistance state Rmax). The low-resistance cell A1 and high-resistance cell B1 each include two cells. One cell of the low-resistance cell A1 has a reference element REF1-1 as an MTJ element, and a transistor Tr1-1. The other cell of the low-resistance cell A1 has a reference element REF1-2 as an MTJ element, and a transistor Tr1-2. One cell of the high-resistance cell B1 has a reference element REF1-3 as an MTJ element, and a transistor Tr1-3. The other cell of the high-resistance cell B1 has a reference cell REF1-4 as an MTJ element, and a transistor Tr1-4.

One terminal of each of the MTJ element MTJ1 and reference elements REF1-1 and REF1-2 is connected to a common bit line BL1-1. One terminal of each of the reference elements REF1-3 and REF1-4 is connected to a common bit line BL1-2. The bit lines BL1-1 and BL1-2 are separated from each other. One end of the current path of each of the transistors Tr1-0, Tr1-1, Tr1-2, Tr1-3, and Tr1-4 is connected to a common bit line BL1-3. By the connection relationships as described above, the low-resistance cell A in which the two cells are connected in parallel and the high-resistance cell B in which the two cells are connected in parallel are connected in series.

A transistor Tr1-5 is connected to one end of the bit line BL1-1, and also connected to the data bus DB1-1. The data bus DB1-1 is connected to the input terminal of the sense amplifier S/A, and a current source L1 is connected to the data bus DB1-1. A transistor Tr1-6 is connected to one end of the bit line BL1-3, and also connected to a data bus DB1-2. The data bus DB1-2 is connected to the ground terminal. The other end of the bit line BL1-3 is not connected to the data bus DB1-1, and one end of the bit line BL1-2 is connected to the data bus DB1-2.

A read operation using read circuit example 1 as described above is performed as follows. When a read object cell is the memory cell 10-1 in the memory cell array CA1, a reference cell 20-2 in the cell array CA2 generates a reference signal. That is, the reference signal is generated by using the reference cell 20-2 connected to the data bus DB2-1 different from the data bus DB1-1 connected to the memory cell 10-1.

First, in the cell array CA1 on the read object side, the MOS transistor Tr1-0 connected in series with the MTJ element MTJ1 is turned on, the transistor Tr1-S inserted between the bit line BL1-1 and data bus DB1-1 is turned on, and the transistor Tr1-6 inserted between the bit line BL1-3 and data bus DB1-2 is turned on. In this state, all transistors except for the transistors Tr1-0, Tr1-5, and Tr1-6 in the cell array CA1 are turned off. Then, the data bus DB1-1 is connected to one input terminal of the sense amplifier S/A, and the data bus DB1-2 is connected to a ground terminal GND. In addition, the current source L1 for a read current is connected to the data bus DB1-1. As a consequence, a read current I1 flows through a path shown in FIG. 5. That is, the read current I1 flows from the current source L1 to the ground germinal GND through the data bus DB1-1, transistor Tr1-5, bit line BL1-1 MTJ element MTJ1, transistor Tr1-0, bit line BL1-3, transistor Tr1-6, and data bus DB1-2.

On the other hand, the reference signal is generated as follows in the cell array CA2 on the reference signal generation side. In the cell array CA2, reference elements REF2-1 and REF2-2 are set in the low-resistance state Rmin (data "0"), and reference elements REF2-3 and REF2-4 are set in the high-resistance state Rmax (data "1"). MOS transistors Tr2-1, Tr2-2, Tr2-3, and Tr2-4 respectively connected in series with the reference elements REF2-1, REF2-2, REF2-3, and REF2-4 are turned on. A transistor Tr2-5 between a bit line BL2-1 connected to the reference elements REF2-1 and REF2-2 and the data bus DB2-1 is turned on. All transistors except for the transistors Tr2-1, Tr2-2, Tr2-3, Tr2-4, and Tr2-5 in the cell array CA2 are turned off. The data bus DB2-1 is connected to the other input terminal of the sense amplifier S/A, and a data bus DB2-2 is connected to the ground terminal GND. In addition, a current source L2 for a read current is connected to the data bus DB2-1. Consequently, a read current I2 flows through a path shown in FIG. 5. That is, the read current I2 flows from the current source L2 to the ground terminal GND through the data bus DB2-1, transistor Tr2-5, bit line BL2-1, reference elements REF2-1 and REF2-2, transistors Tr2-1 and Tr2-2, bit line BL2-3, transistors Tr2-3 and Tr2-4, reference elements REF2-3 and REF2-4, bit line BL2-2, and data bus DB2-2.

By making the connections as described above, the synthetic resistance generated between the data buses DB2-1 and DB2-2 by the reference elements REF2-1, REF2-2, REF2-3, and REF2-4 becomes Rmid=(Rmax+Rmin)/2. The sense amplifier S/A compares the middle resistance Rmid thus generated by the reference cell 20-2 with the resistance value of the MTJ element MTJ1 of the memory cell 10-1, thereby reading out the data. More specifically, the data is regarded as "1" if the resistance value of the MTJ element MTJ1 is higher than the middle resistance Rmid, and as "0" if the resistance value of the MTJ element MTJ1 is lower than the middle resistance of the MTJ element MTJ1.

[3-2] Read Circuit Example 2

Figure 6:
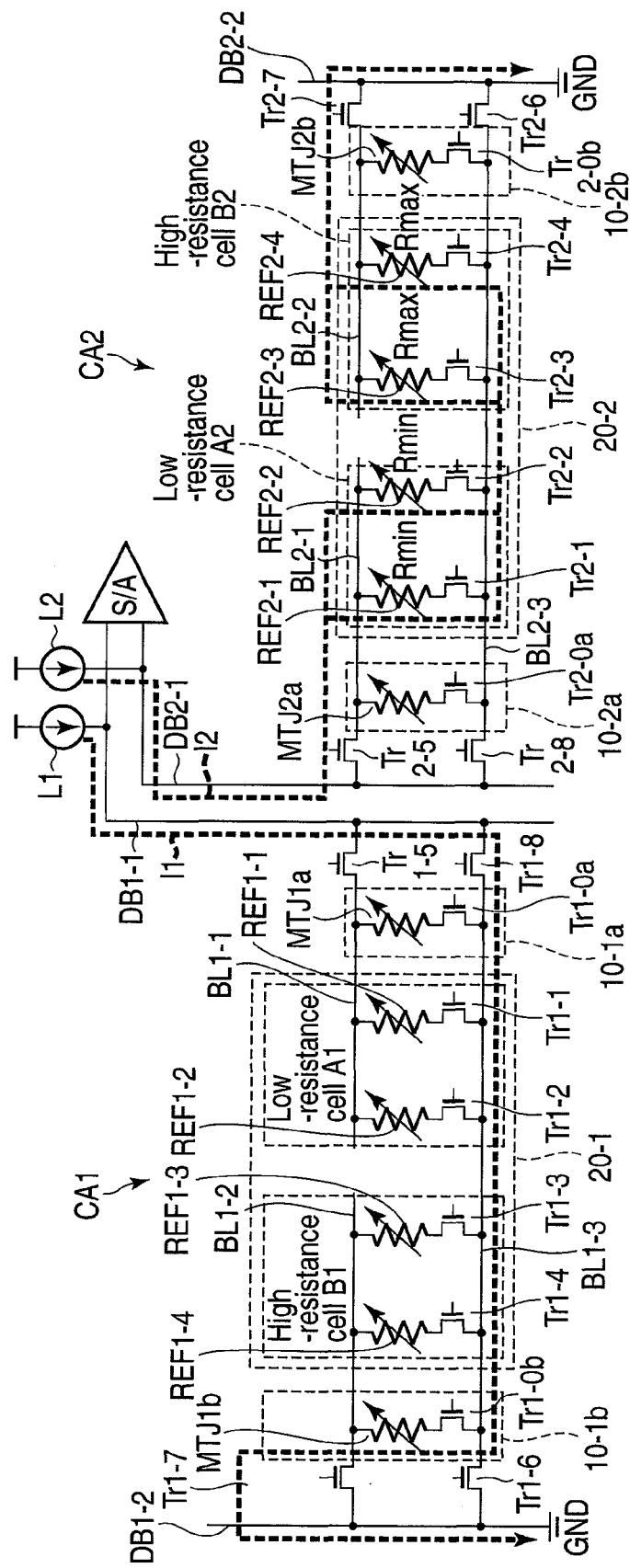
FIG. 6 is a schematic circuit diagram of read circuit example 2 of the magnetic random access memory according to the embodiment of the present invention.

FIG. 6 is a schematic circuit diagram of read circuit example 2 of the magnetic random access memory according to the embodiment of the present invention. Although cell arrays CA1 and CA2 are simplified in FIG. 6, memory cell groups and reference cell groups are formed in the same manner as in read circuit example 1. The circuit configuration of read circuit example 2 of this embodiment will be explained below together with the circuit configuration of the memory cell. Note that an explanation of the same arrangements as those of read circuit example 1 will not be repeated.

In read circuit example 1 shown in FIG. 5 described above, the memory cell 10-1 as a read object cell is connected to the bit line BL1-1. In read circuit example 2 shown in FIG. 6, however, a memory cell 10-1*b* as a read object cell is connected to a bit line BL1-2 as well.

More specifically, as shown in FIG. 6, not only a memory cell 10-1*a* is connected to a bit line BL1-1, but also the memory cell 10-1*b* is connected to the bit line BL1-2. Since the memory cell 10-1*b* connected to the bit line BL1-2 is a read object cell, the cell array CA1 of read circuit example 2 has an arrangement obtained by adding transistors Tr1-7 and Tr1-8 to the circuit configuration of read circuit example 1. The transistor Tr1-7 is formed between the bit line BL1-2 and a data bus DB1-2. The transistor Tr1-8 is formed between a bit line BL1-3 and data bus DB1-1.

A read operation using read circuit example 2 as described above is performed as follows. In this operation, a read object cell is the memory cell 10-1*b* in the cell array CA1, and a reference cell 20-2 in the cell array CA2 generates a reference signal.

First, in the cell array CA1 on the read object side, a MOS transistor Tr1-0*b* connected to an MTJ element MTJ1*b* is turned on, the transistor Tr1-8 inserted between the bit line BL1-3 and data bus DB1-1 is turned on, and the transistor Tr1-7 inserted between the bit line BL1-2 and data bus DB1-2 is turned on. In this state, all transistors except for the transistors Tr1-0*b*, Tr1-7, and Tr1-8 in the cell array CA1 are turned off. The data bus DB1-1 is connected to one input terminal of a sense amplifier S/A, and the data bus DB1-2 is connected to a ground terminal GND. In addition, a current source L1 for a read current is connected to the data bus DB1-1. As a consequence, a read current I1 flows through a path shown in FIG. 6. That is, the read current I1 flows from the current source L1 to the ground terminal GND via the is data bus DS1-1, transistor Tr1-8, bit line BL1-3, transistor Tr1-0*b*, MTJ element MTJ1*b*, bit line BL1-2, transistor Tr1-7, and data bus DB1-2.

On the other hand, in the cell array CA2 on the reference signal generation side, a read current I2 is supplied in the same manner as in read circuit example 1 described above, thereby generating synthetic resistance Rmid=(Rmax+Rmin)/2 between data buses DB2-1 and DB2-2 by reference elements REF2-1, REF2-2, REF2-3, and REF2-4. The sense amplifier S/A compares the middle resistance Rmid thus generated by the reference cell 20-2 with the resistance value of the MTJ element MTJ1*b* of the memory cell 10-1*b*, thereby reading out the data.

In read circuit example 2 as described above, the transistor Tr1-7 is formed between the bit line BL1-2 and data bus DB1-2, and the transistor Tr1-8 is formed between the bit line BL1-3 and data bus DB1-1. Accordingly, data can be read out from the memory cell 10-1*b* connected to the bit line BL1-2.

[3-3] Read Circuit Example 3

Figure 7:
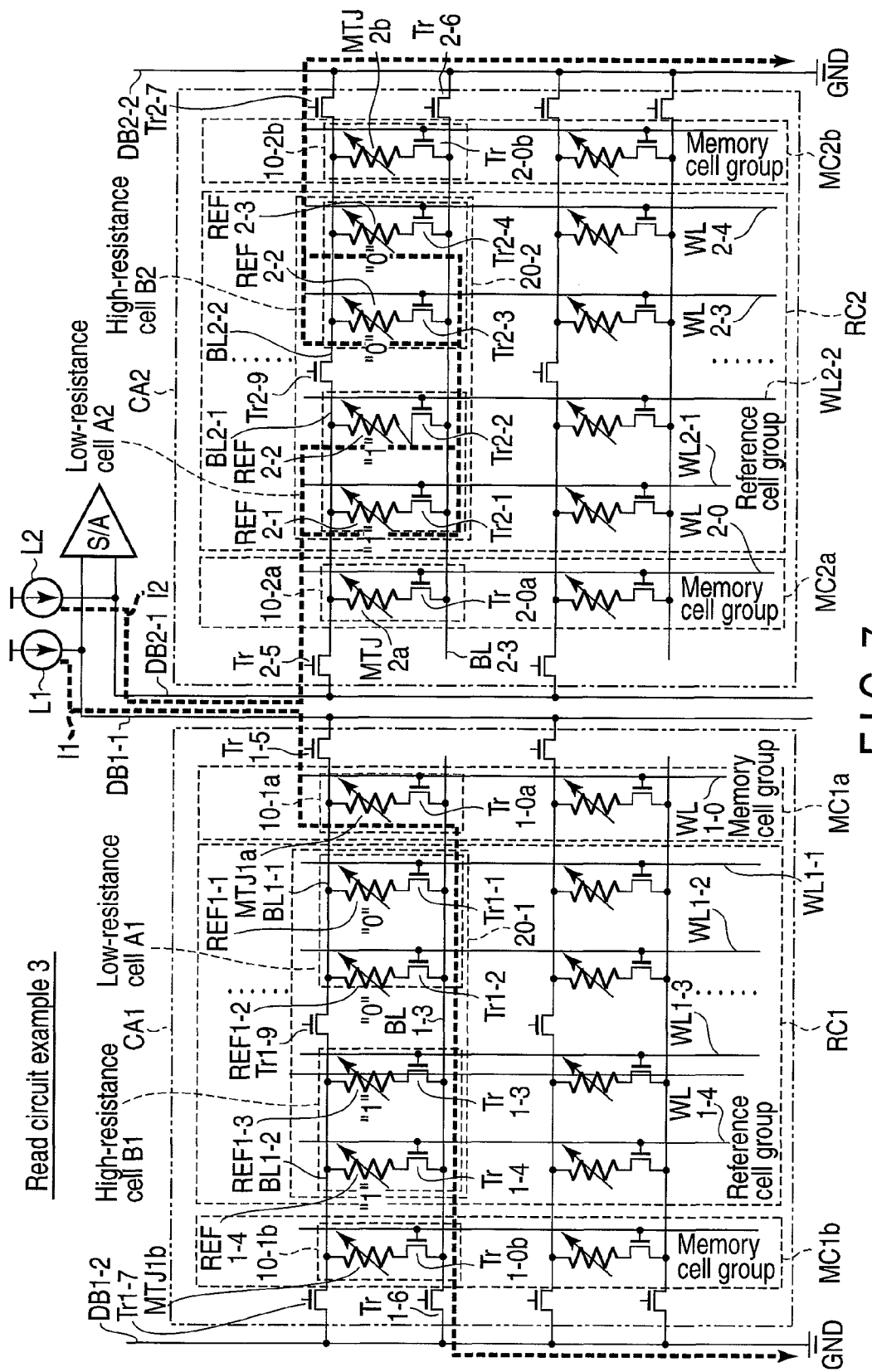
FIG. 7 is a schematic circuit diagram of read circuit example 3 of the magnetic random access memory according to the embodiment of the present invention.
Figure 8:
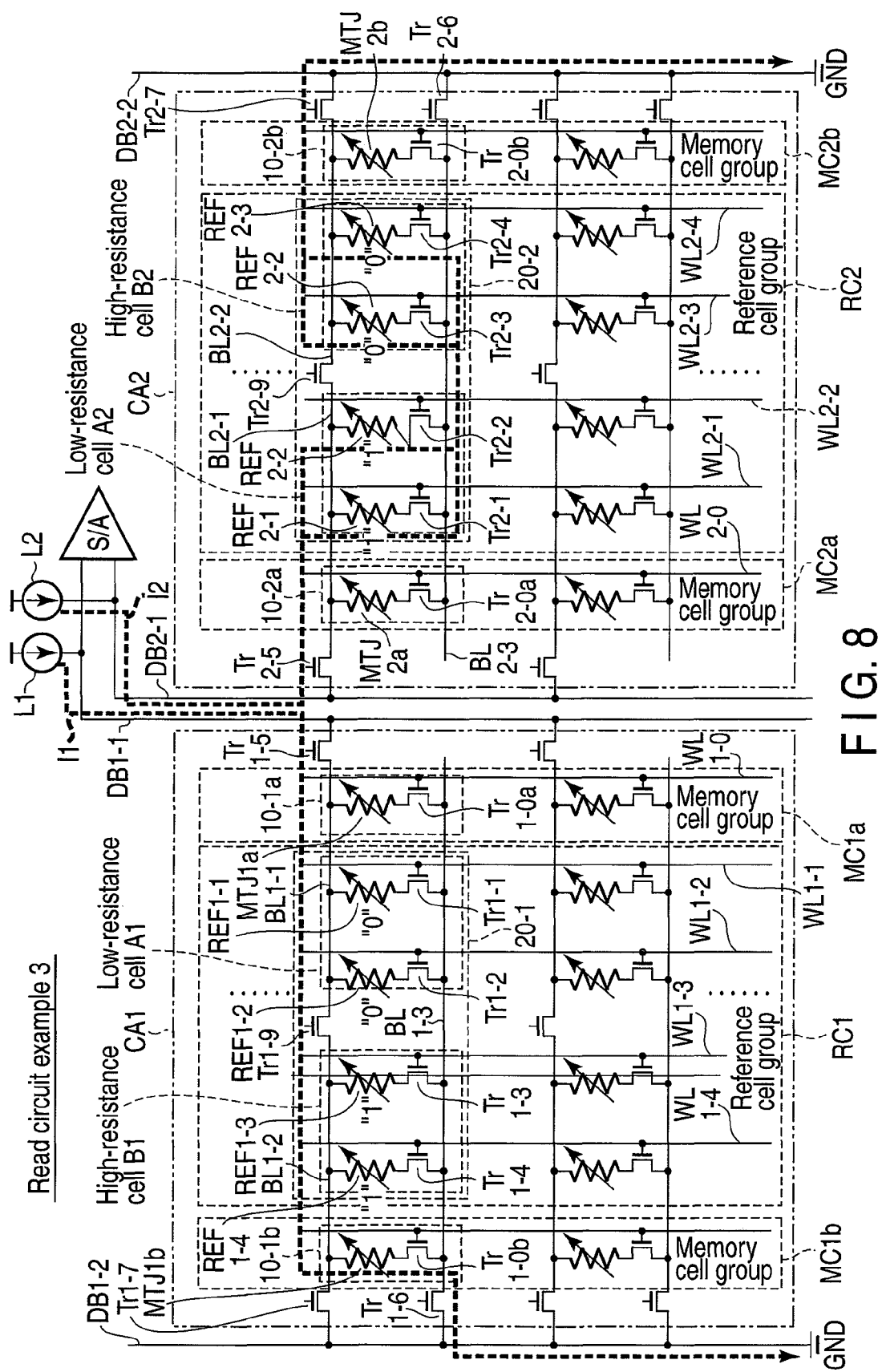
FIG. 8 is a schematic circuit diagram of read circuit example 3 of the magnetic random access memory according to the embodiment of the present invention.

FIGS. 7 and 8 are schematic circuit diagrams of read circuit example 3 of the magnetic random access memory according to the embodiment of the present invention. The circuit configuration of read circuit example 3 of this embodiment will be explained below together with the circuit configuration of the memory cell. Note that an explanation of the same arrangements as those of read circuit example 1 will not be repeated.

In read circuit example 1 shown in FIG. 5 described earlier, the bit lines BL1-1 and BL1-2 are separated. In a cell array CA1 of read circuit example 3 shown in FIGS. 7 and 8, however, a transistor Tr1-9 is inserted between bit lines BL1-1 and BL1-2, and the bit lines BL1-1 and BL1-2 are electrically connected/disconnected by turning on/off the transistor Tr1-9. Furthermore, a transistor Tr1-7 is formed between the bit line BL1-2 and a data bus DB1-2.

A read operation using read circuit example 3 as described above is performed as follows. In this operation, a read object cell is a memory cell 10-1*a* or memory cell 10-1*b* in the cell array CA1, and a reference cell 20-2 in a cell array CA2 generates a reference signal. Note that since the reference signal is generated in the same manner as in read circuit example 1 described above, an explanation of the operation will not be repeated.

First, the case where data in the memory cell 10-1*a* is read out will be explained below with reference to FIG. 7. In the cell array CA1 on the read object side, a MOS transistor Tr1-0*a* connected in series with an MTJ element MTJ1*a* is turned on, a transistor Tr1-5 inserted between the bit line BL1-1 and a data bus DB1-1 is turned on, and a transistor Tr1-6 inserted between a bit line BL1-3 and the data bus DB1-2 is turned on. In this state, all transistors except for the transistors Tr1-0*a*, Tr1-5, and Tr1-G in the cell array CA1 are turned off. The data bus DB1-1 is connected to one input terminal of a sense amplifier S/A, and the data bus DB1-2 is connected to a ground terminal GND. In addition, a current source L1 for a read current is connected to the data bus DB1-1. Consequently, a read current I1 flows through a path shown in FIG. 7 in the same manner as in read circuit example 1 shown in FIG. 5. That is, the read current I1 flows from the current source L1 to the ground terminal GND through the data bus DB1-1, transistor Tr1-5, bit line BL1-1, MTJ element MTJ1*a*, transistor Tr1-0*a*, bit line BL1-3, transistor Tr1-G, and data bus DB1-2.

When reading out data from the memory cell 10-1*a* as described above, both the transistor Tr1-9 between the bit lines BL1-2 and BL1-3 and a transistor Tr2-9 between bit lines BL2-2 and BL2-3 are OFF.

The case where data in the memory cell 10-1b is read out will now be explained with reference to FIG. 8. In the cell array CA1 on the read object side, a MOS transistor Tr1-0b connected in series with an MTJ element MTJ1b is turned on, the transistor Tr1-5 inserted between the bit line BL1-1 and data bus DB1-1 is turned on, and the transistor Tr1-9 inserted between the bit lines BL1-1 and BL1-2 is turned on. The transistor Tr1-6 inserted between the bit line BL1-3 and data bus DB1-2 is turned on. In this state, all transistors except for the transistors Tr1-0b, Tr1-5, Tr1-6, and Tr1-9 in the cell array CA1 are turned off. The data bus DB1-1 is connected to one input terminal of the sense amplifier S/A, and the data bus DB1-2 is connected to the ground terminal GND. In addition, the current source L1 for a read current is connected to the data bus DB1-1. As a result, the read current I1 flows through a path shown in FIG. 8. That is, the read current I1 flows from the current source L1 to the ground terminal GND through the data bus DB1-1, transistor Tr1-5, bit line BL1-1, transistor Tr1-9, bit line BL1-2, MTJ element MTJ1b, transistor Tr1-0b, bit line BL1-2, transistor Tr1-6, and data bus DB1-2.

When reading out data from the memory cell 10-1b as described above, the transistor Tr1-9 between the bit lines BL1-2 and BL1-3 is ON, but the transistor Tr2-9 between the bit lines BL2-2 and BL2-3 is OFF.

The resistance of the MTJ element MTJ1a or MTJ1b from which the data is read out is compared with the middle resistance Rmid generated by the reference cell 20-2, thereby discriminating the data.

In read circuit example 3 as described above, the transistor Tr1-9 is formed between the bit lines BL1-1 and BL1-2 in the cell array CA1. When reading out data from the memory cell 10-1b connected to the bit line BL1-2, therefore, it is possible to control the direction of the read current by turning on the transistors Tr1-5, Tr1-6, and Tr1-9, and form a current path different from that of read circuit example 2. That is, in read circuit example 3, an electric current can be supplied in the opposite direction to that of read circuit example 2, i.e., can be supplied from the MTJ element MTJ1b to the transistor Tr1-0b in the cell 10-1b as a read object.

[3-4] Read Circuit Example 4

Figure 9:
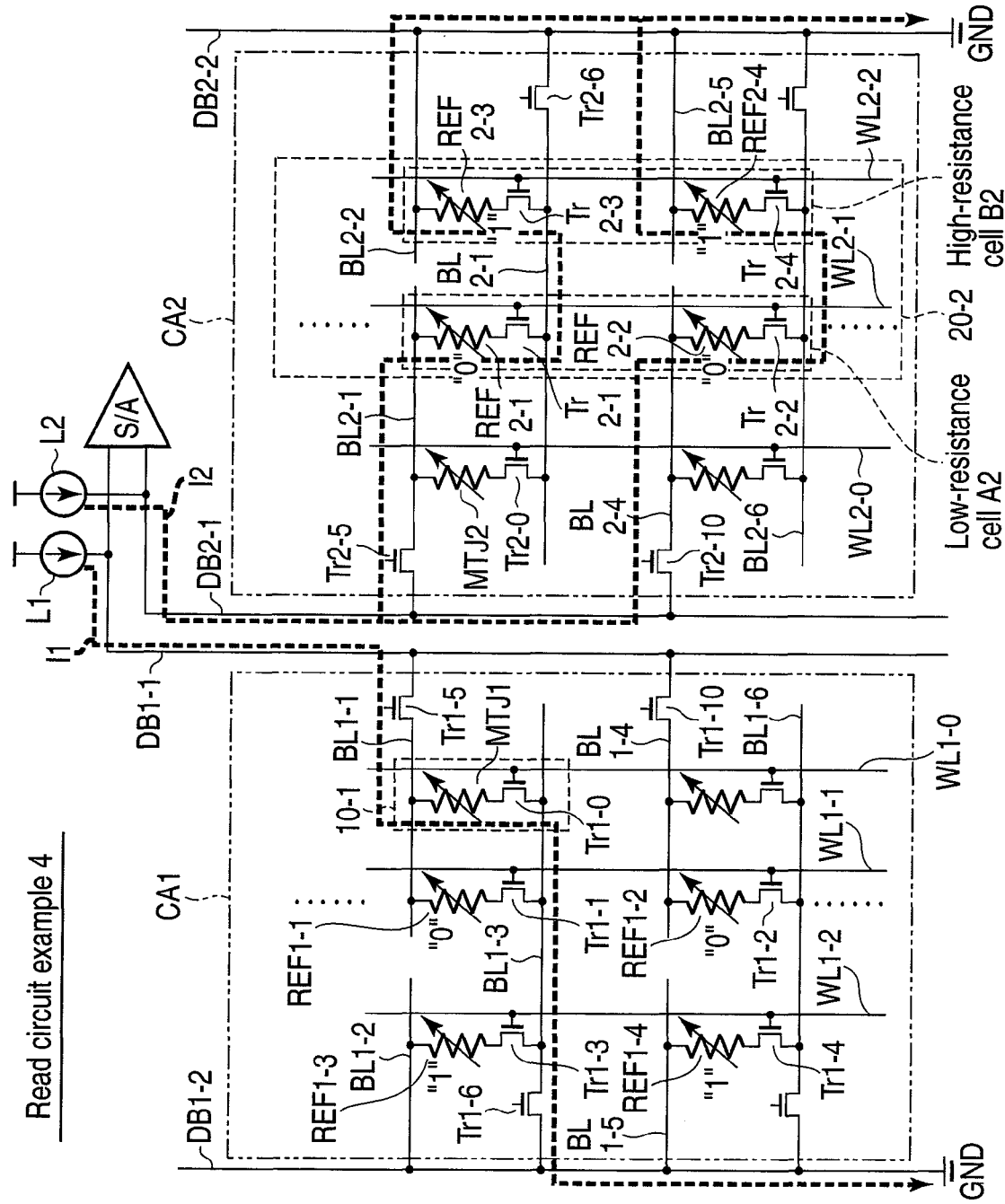
FIG. 9 is a schematic circuit diagram of read circuit example 4 of the magnetic random access memory according to the embodiment of the present invention.

FIG. 9 is a schematic circuit diagram of read circuit example 4 of the magnetic random access memory according to the embodiment of the present invention. The circuit configuration of read circuit example 4 of this embodiment will be explained below together with the circuit configuration of the memory cell.

In read circuit examples 1 to 3 described above, the reference cell group RC1, for example, uses the four word lines WL1-1, WL1-2, WL1-3, and WL1-4. In read circuit example 4, however, a reference cell group RC1, for example, uses two word lines WL1-1 and WL1-2. A practical arrangement will be explained below by taking a reference cell 20-2 of a cell array CA2 as an example.

As shown in FIG. 9, transistors Tr2-1 and Tr2-2 of a low-resistance cell A2 are connected to the same word line WL2-1, and transistors Tr2-3 and Tr2-4 of a high-resistance cell B2 are connected to the same word line WL2-2.

One cell of the low-resistance cell A2 and one cell of the high-resistance cell B2 are arranged in the same column, and the other cell of the low-resistance cell A2 and the other cell of the high-resistance cell B2 are arranged in the same column. That is, the low-resistance cell A2 including a reference element REF2-1 and the transistor Tr2-1 is connected to bit lines BL2-1 and BL2-3, and the high-resistance cell B2 including a reference element REF2-3 and the transistor Tr2-3 is connected to a bit line BL2-2 and the bit line BL2-3. On the other hand, the low-resistance cell A2 including a reference element REF2-2 and the transistor Tr2-2 is connected to bit lines BL2-4 and BL2-6, and the high-resistance cell B2 including a reference element REF2-4 and the transistor Tr2-4 is connected to bit lines BL2-5 and BL2-6. The bit lines BL2-1 and BL2-4 are connected to a common data bus DB2-1, and the bit lines BL2-2 and BL2-5 are connected to a common data bus DB2-2.

A read operation using read circuit example 4 as described above is performed as follows. In this operation, a read object cell is a memory cell 10-1 in a cell array CA1, and the reference cell 20-2 in the cell array CA2 generates a reference signal. Note that the resistance value of the memory cell 10-1 is read out in the same manner as in read circuit example 1 described previously, so a repetitive explanation will be omitted.

A reference signal is generated as follows in the cell array CA2 on the reference signal generation side. In the cell array CA2, the reference elements REF2-1 and REF2-2 are set in the low-resistance state Rmin (data "0"), and the reference elements REF2-3 and REF2-4 are set in the high-resistance state Rmax (data "1"). The MOS transistors Tr2-1, Tr2-2, Tr2-3, and Tr2-4 respectively connected in series with the reference elements REF2-1, REF2-2, REF2-3, and REF2-4 are turned on. A transistor Tr2-5 between the bit line BL2-1 connected to the reference element REF2-1 and the data bus DB2-1 is turned on. A transistor Tr2-10 between the bit line BL2-4 connected to the reference element REF2-2 and the data bus DB2-1 is turned on. All transistors except for the transistors Tr2-1, Tr2-2, Tr2-3, Tr2-4, Tr2-5, and Tr2-10 in the cell array CA2 are turned off. The data bus DB2-1 is connected to the other input terminal of a sense amplifier S/A, and the data bus DB2-2 is connected to a ground terminal GND. In addition, a current source L2 for a read current is connected to the data bus DB2-1. As a consequence, a read current I2 flows through a path shown in FIG. 9. That is, the read current I2 flows from the current source L2 to the data bus DB2-1, transistor Tr2-5, bit line BL2-1, reference element REF2-1, transistor Tr2-1, bit line BL2-3, transistor Tr2-3, reference element REF2-3, bit line BL2-2, and data bus DB2-2, and also flows from the current source L2 to the data bus DB2-1, transistor Tr2-10, bit line BL2-4, reference element REF2-3, transistor Tr2-3, bit line BL2-6, transistor Tr2-4, reference element REF2-4, bit line BL2-5, and data bus DB2-2.

By making the connections as described above, the synthetic resistance generated between the data buses DB2-1 and DB2-2 by the reference elements REF2-1, REF2-2, REF2-3, and REF2-4 becomes Rmid (Rmax+Rmin)/2 as in read circuit examples 1 to 3. The sense amplifier S/A compares the middle resistance Rmid thus generated by the reference cell 20-2 with the resistance value of an MTJ element MTJ1 of the memory cell 10-1, thereby reading out the data.

Read circuit example 4 as described above has the following effects. In read circuit examples 1 to 3, one data column is used, and word lines are formed in one-to-one correspondence with the four reference cells. Accordingly, the four word lines must be simultaneously activated in a read operation. Since this makes it necessary to charge a very large capacity, the read time may prolong, In read circuit example 4, however, the number of word lines to be simultaneously activated in a read operation can be halved because two data columns are used. Therefore, the read time can be made shorter than that of read circuit examples 1 to 3.

[4] Write Circuits

The write operation of this embodiment uses the spin transfer torque writing method. In the spin transfer torque writing method, the magnetization in the free layer is reversed by directly supplying an electric current to the MTJ element. The direction of the electric current determines the relative magnetization direction of the free layer with respect to that of the pinned layer. More specifically, an electric current flowing from the free layer to the pinned layer makes the magnetizations in the free layer and pinned layer parallel, and an electric current flowing from the pinned layer to the free layer makes the magnetizations in the free layer and pinned layer antiparallel. In the spin transfer torque writing method, therefore, a write current flows through the MTJ element in the two directions.

In this embodiment, data is written in the MTJ elements of the memory cell and reference cell by using the spin transfer torque writing method as described above. Write circuits for achieving this write operation will be described in detail below. Note that in each write circuit example, the pinned layer p of an MTJ element MTJ as a write object is connected to a transistor Tr. Note also that the MTJ element as a write object may be either a memory cell or reference cell in the following explanation.

[4-1] Write Circuit Example 1

Figure 10:
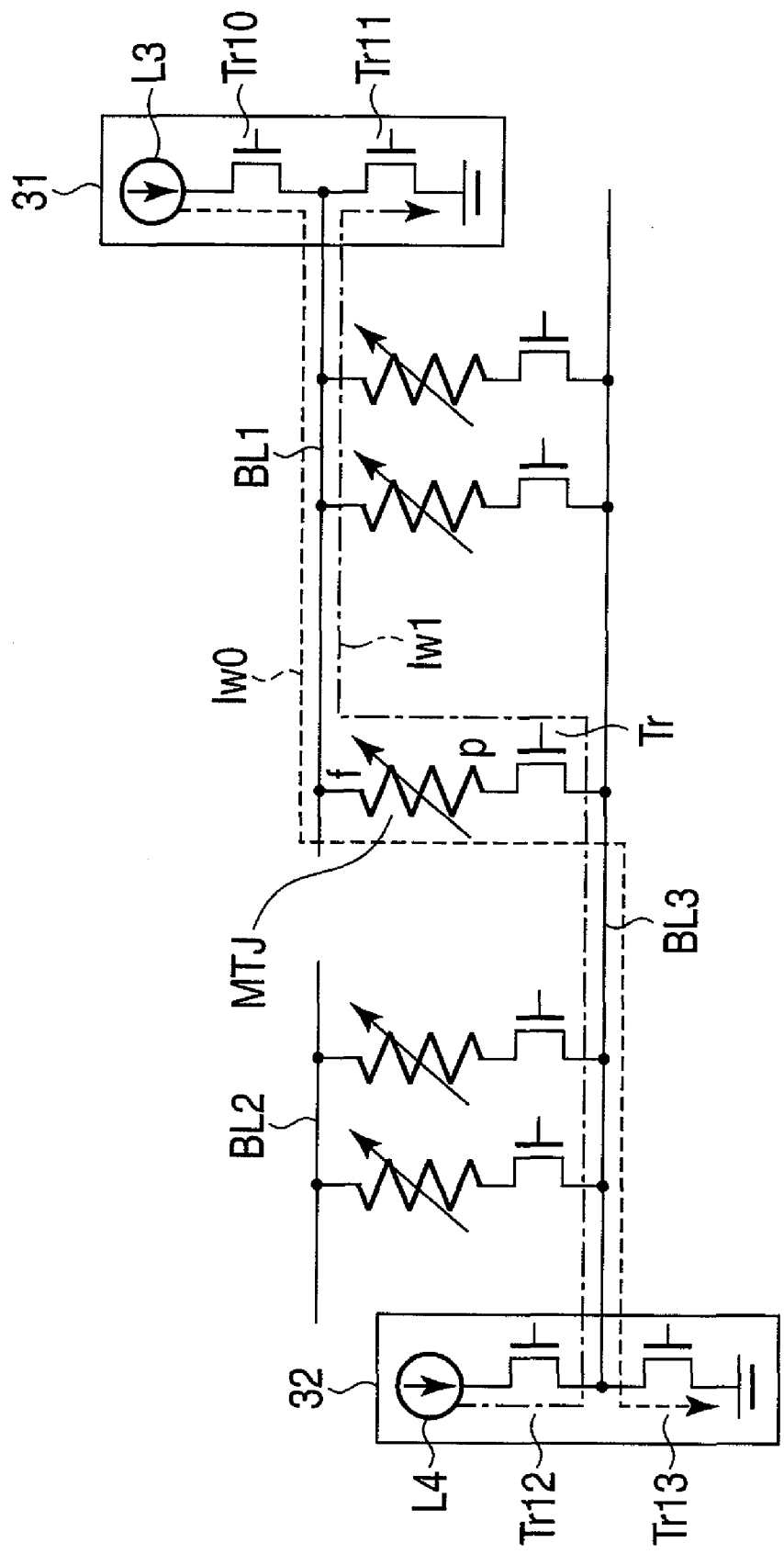
FIG. 10 is a schematic circuit diagram of write circuit example 1 of the magnetic random access memory according to the embodiment of the present invention.

FIG. 10 is a schematic circuit diagram of write circuit example 1 of the magnetic random access memory according to the embodiment of the present invention. The circuit configuration of write circuit example 1 of this embodiment will be explained below.

Write circuit example 1 shown in FIG. 10 is used in the case where a write object cell is attached to only a bit line BL1. In this case, a source/sinker circuit 31 is connected to one end of the bit line BL1, and a source/sinker circuit 32 is connected to one end of a bit line BL3. The source/sinker circuits 31 and 32 are positioned at the end portions on the opposite sides of the bit lines BL1 and BL3. However, the source/sinker circuits 31 and 32 may also be positioned at the end portions on the same side of the bit lines BL1 and BL3.

The source/sinker circuit 31 includes a write current source L3 and transistors Tr10 and Tr11. The current path of the transistor Tr10 has one end connected to the current source L3, and the other end connected to one end of the current path of the transistor Tr11. The other end of the current path of the transistor Tr11 is connected to the ground terminal. A connection node between the transistors Tr10 and Tr11 is connected to the end portion of the bit line BL1.

The source/sinker circuit 32 includes a write current source L4 and transistors Tr12 and Tr13. The current path of the transistor Tr12 has one end connected to the current source L4, and the other end connected to one end of the current path of the transistor Tr13. The other end of the current path of the transistor Tr13 is connected to the ground terminal. A connection node between the transistors Tr12 and Tr13 is connected to the end portion of the bit line BL3.

A write operation using write circuit example 1 as described above is performed as follows.

First, when writing "0", a write current Iw0 is supplied from the free layer f to the pinned layer p of the MTJ element MTJ. Accordingly, the transistor Tr connected to the MTJ element MTJ is turned on, the transistor Tr10 of the source/sinker circuit 31 connected to the bit line BL1 is turned on, the transistor Tr13 of the source/sinker circuit 32 connected to the bit line BL3 is turned on, and the transistors Tr11 and Tr12 are turned off. As a result, the write current Iw0 flows from the current source L3 to the MTJ element MTJ through the transistor Tr10 and bit line BL1. Then, the write current Iw0 flows into the ground terminal through the transistor Tr, bit line BL3, and transistor Tr13.

On the other hand, when writing "1", a write current Iw1 is supplied from the pinned layer p to the free layer f of the MTJ element MTJ. Accordingly, the transistor Tr connected to the MTJ element MTJ is turned on, the transistor Tr11 of the source/sinker circuit 31 connected to the bit line BL1 is turned on, the transistor Tr12 of the source/sinker circuit 32 connected to the bit line BL3 is turned on, and the transistors Tr10 and Tr13 are turned off. Consequently, the write current Iw1 flows from the current source L4 to the MTJ element MTJ through the transistor Tr12, bit line BL3, and transistor Tr. Then, the write current Iw1 flows into the ground terminal through the bit line BL1 and transistor Tr11.

Note that when a write object cell is attached to only a bit line BL2, the source/sinker circuit 31 need only be connected to one end of the bit line BL2.

[4-2] Write Circuit Example 2

Figure 11:
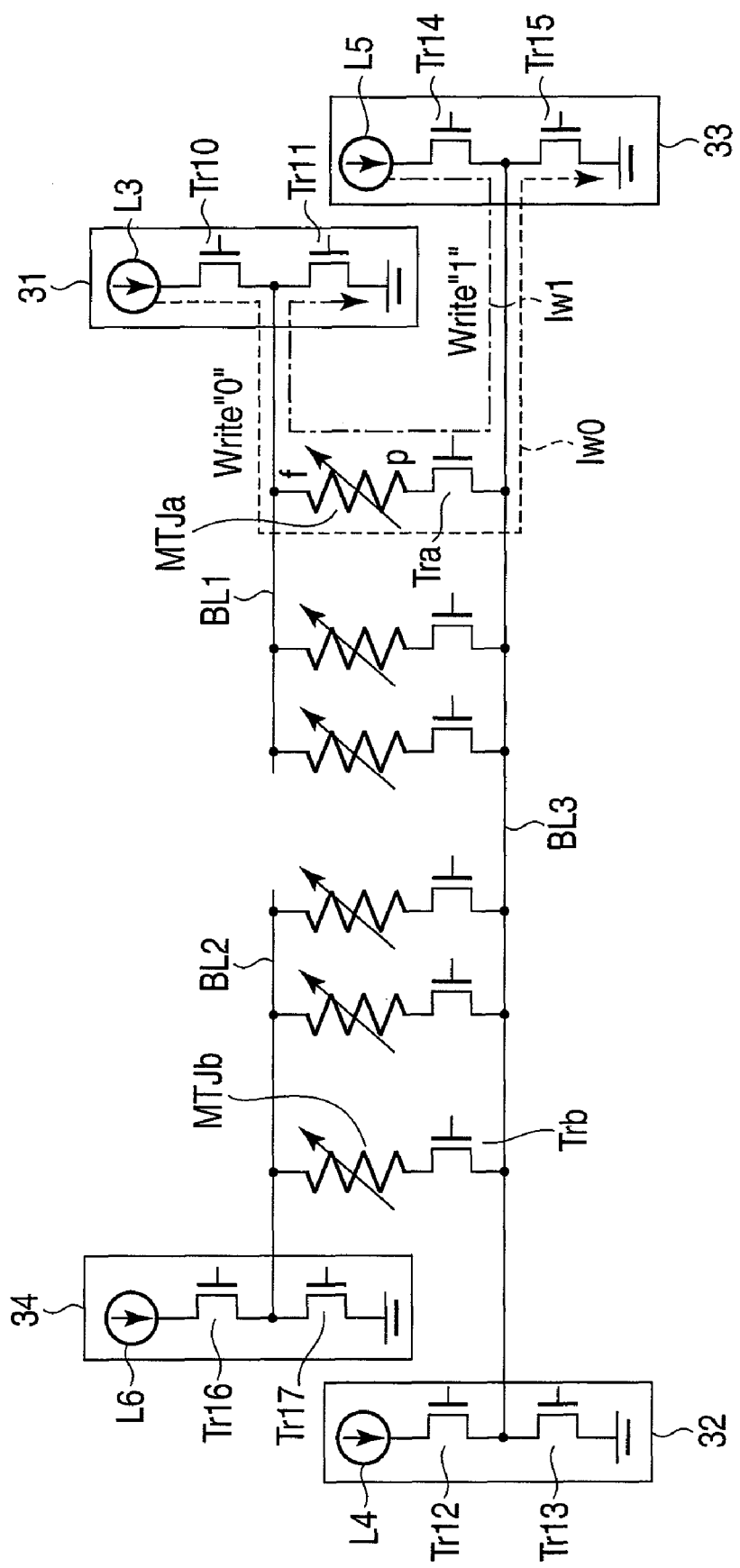
FIG. 11 is a schematic circuit diagram of write circuit example 2 of the magnetic random access memory according to the embodiment of the present invention.
Figure 12:
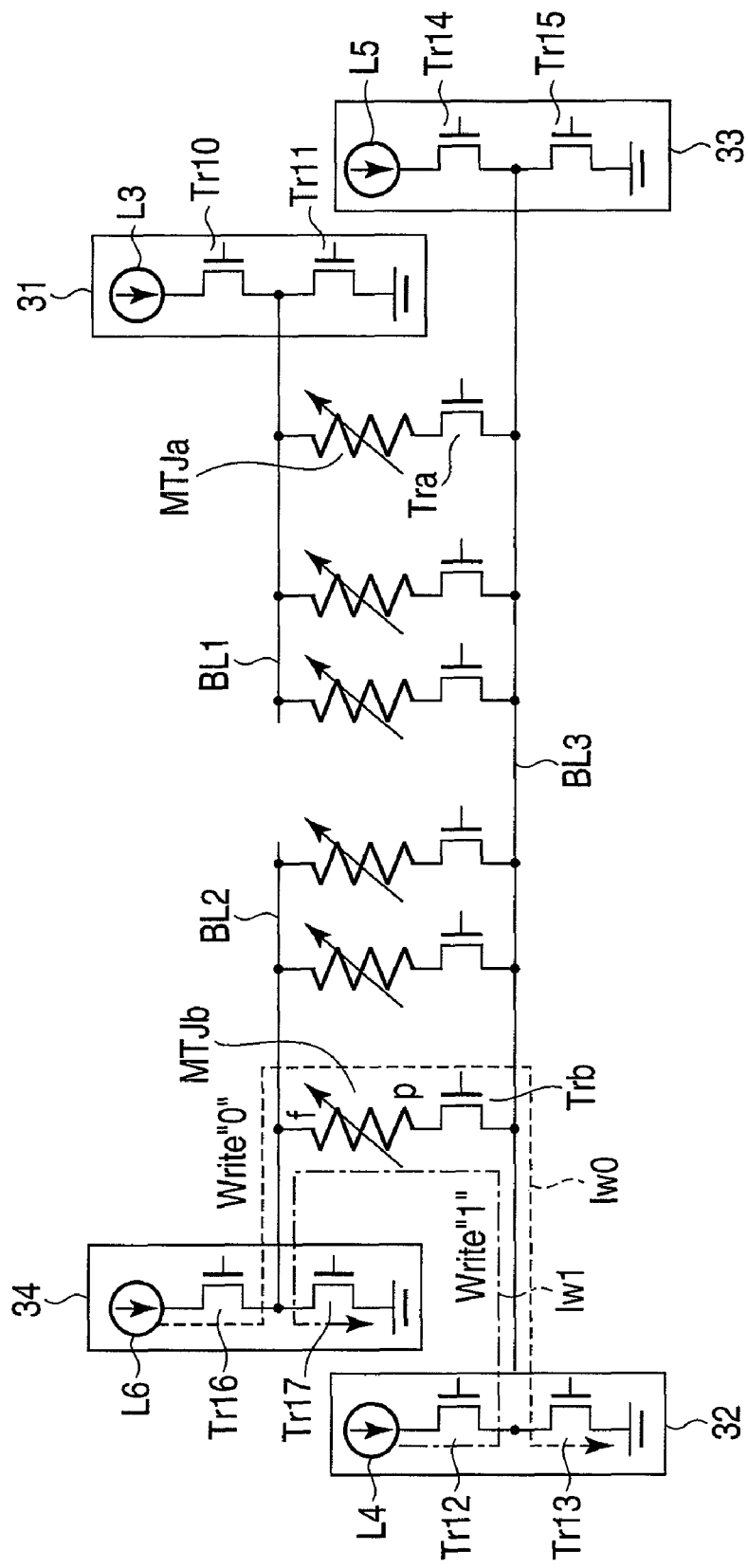
FIG. 12 is a schematic circuit diagram of write circuit example 2 of the magnetic random access memory according to the embodiment of the present invention.

FIGS. 11 and 12 are schematic circuit diagrams of write circuit example 2 of the magnetic random access memory according to the embodiment of the present invention. The circuit configuration of write circuit example 2 of this embodiment will be explained below.

Write circuit example 2 shown in FIGS. 11 and 12 is used in the case where write object cells are attached to both bit lines BL1 and BL2.

As shown in FIG. 11, source/sinker circuits 31 and 33 are used when writing data in a cell connected to the bit line BL1. The source/sinker circuit 31 is connected to one end of the bit line BL1, and the source/sinker circuit 33 is connected to one end of a bit line BL3. The source/sinker circuits 31 and 33 are positioned at the end portions on the same side of the bit lines BL1 and BL3. Similar to the source/sinker circuit 31, the source/sinker circuit 33 includes a write current source L5 and two transistors Tr14 and Tr15.

A write operation using write circuit example 2 shown in FIG. 11 as described above is performed as follows.

First, when writing "0", a transistor Tra connected to an MTJ element MTJa is turned on, a transistor Tr10 of the source/sinker circuit 31 connected to the bit line BL1 is turned on, the transistor Tr15 of the source/sinker circuit 33 connected to the bit line BL3 is turned on, and transistors Tr11, Tr12, and Tr13, the transistor Tr14, and transistors Tr16 and Tr17 are turned off. As a consequence, a write current Iw0 flows as shown in FIG. 11, and data "0" is written in the MTJ element MTJa.

On the other hand, when writing "1", the transistor Tra connected to the MTJ element MTJa is turned on, the transistor Tr11 of the source/sinker circuit 31 connected to the bit line BL1 is turned on, the transistor Tr14 of the source/sinker circuit 33 connected to the bit line BL3 is turned on, and the transistors Tr10, Tr12, Tr13, Tr15, Tr1, and Tr17 are turned off. Consequently, a write current Iw1 flows as shown in FIG. 11, and data "1" is written in the MTJ element MTJa.

As shown in FIG. 12, source/sinker circuits 32 and 34 are used when writing data in a cell connected to the bit line BL2. The source/sinker circuit 32 is connected to one end of the bit line BL2, and the source/sinker circuit 34 is connected to the other end of the bit line BL3. The source/sinker circuits 32 and 34 are positioned at the end portions on the same side of the bit lines BL1 and BL3. Similar to the source/sinker circuit 32, the source/sinker circuit 34 includes a write current source L6 and the two transistors Tr16 and Tr17.

A write operation using write circuit example 2 shown in FIG. 12 as described above is performed as follows.

First, when writing "0", a transistor Trb connected to an MTJ element MTJb is turned on, the transistor Tr16 of the source/sinker circuit 34 connected to the bit line BL2 is turned on, the transistor Tr13 of the source/sinker circuit 32 connected to the bit line BL3 is turned on, and the transistors Tr10, Tr11, Tr12, Tr14, Tr15, and Tr17 are turned off. As a consequence, the write current Iw0 flows as shown in FIG. 12, and data "0" is written in the MTJ element MTJb.

On the other hand, when writing "1", the transistor Trb connected to the MTJ element MTJb is turned on, the transistor Tr17 of the source/sinker circuit 34 connected to the bit line BL2 is turned on, the transistor Tr12 of the source/sinker circuit 32 connected to the bit line BL3 is turned on, and the transistors Tr10, Tr11, Tr13, Tr14, Tr15, and Tr16 are turned off. Consequently, the write current Iw1 flows as shown in FIG. 12, and data "1" is written in the MTJ element MTJb.

Note that in write circuit example 2 described above, the source/sinker circuits 31 and 33 are used when writing data in the MTJ element MTJa connected to the bit line BL1. However, the source/sinker circuits 31 and 32 may also be used. Note also that the source/sinker circuits 32 and 34 are used when writing data in the MTJ element MTJb connected to the bit line BL2, but the source/sinker circuits 33 and 34 may also be used.

[4-3] Write Circuit Example 3

Figure 13:
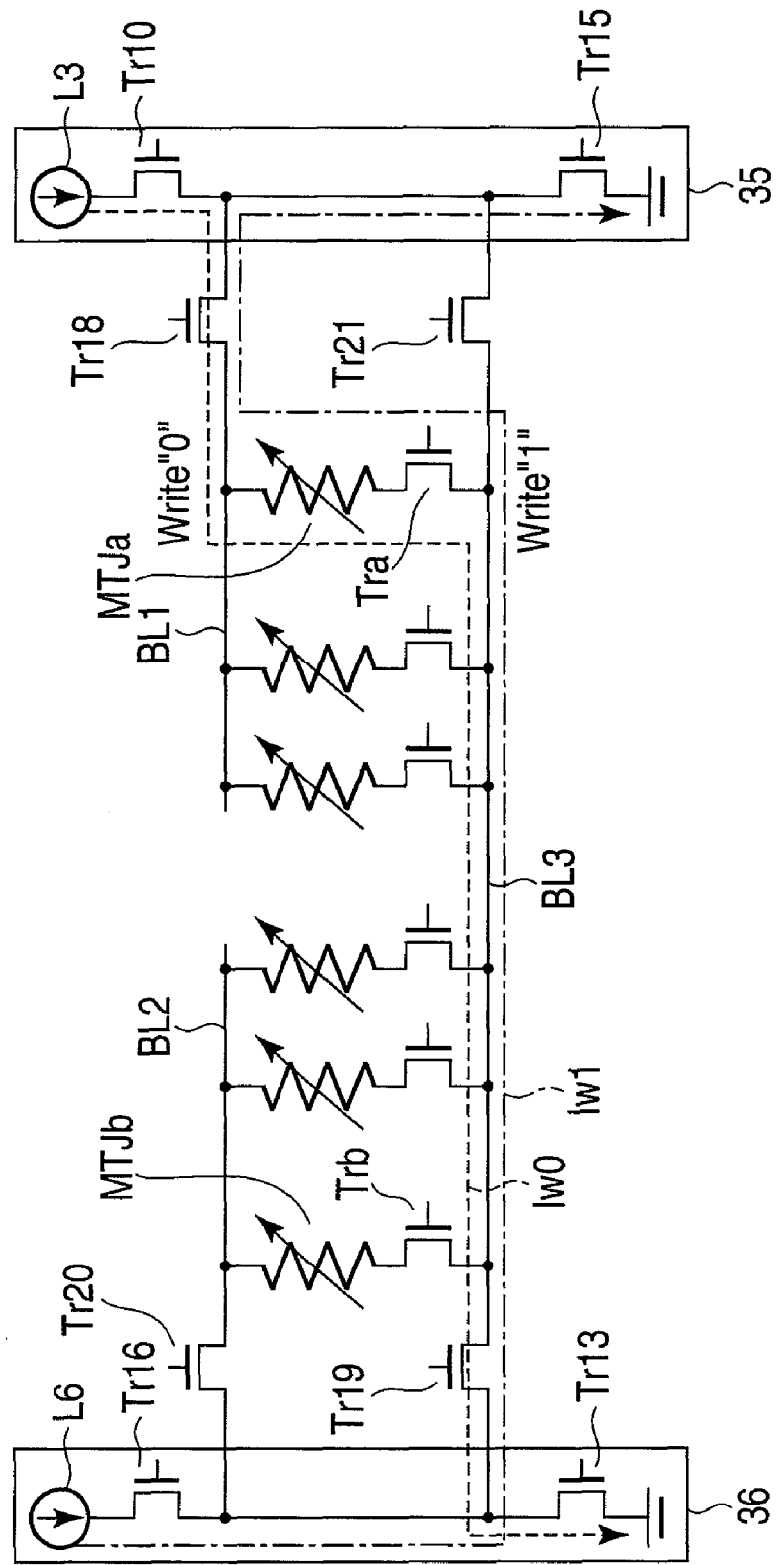
FIG. 13 is a schematic circuit diagram of write circuit example 3 of the magnetic random access memory according to the embodiment of the present invention.
Figure 14:
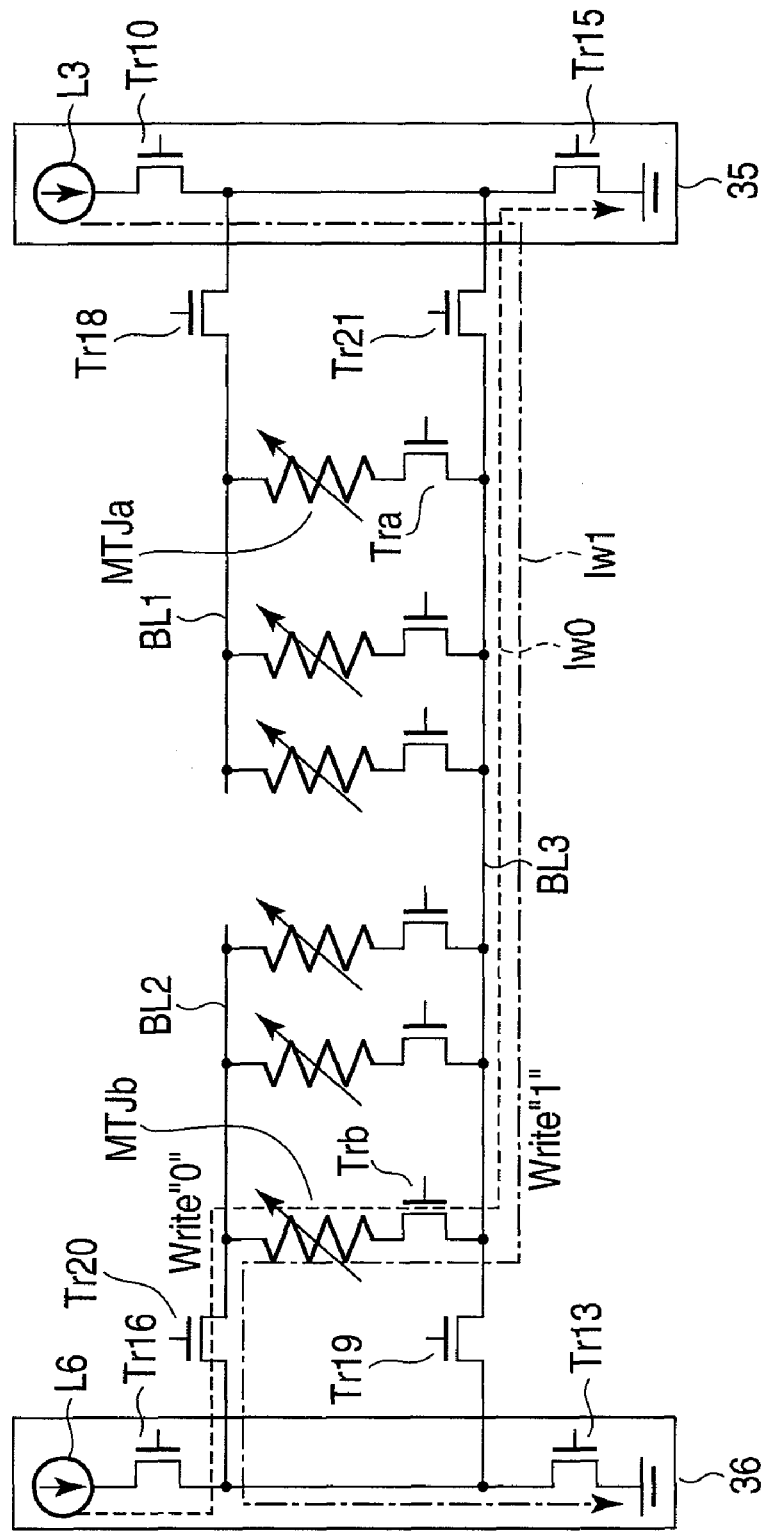
FIG. 14 is a schematic circuit diagram of write circuit example 3 of the magnetic random access memory according to the embodiment of the present invention.

FIGS. 13 and 14 are schematic circuit diagrams of write circuit example 3 of the magnetic random access memory according to the embodiment of the present invention. The circuit configuration of write circuit example 3 of this embodiment will be explained below.

In write circuit example 3 shown in FIGS. 13 and 14, two source/sinker circuits 35 and 36 replace the four source/sinker circuits 31, 32, 33, and 34 of write circuit example 2.

More specifically, the source/sinker circuit 35 is formed at the end portions of bit lines BL1 and BL3, and the source/sinker circuit 36 is formed at the end portions of a bit line BL2 and the bit line BL3. A transistor Tr18 is formed between the source/sinker circuit 35 and bit line EL1. A transistor Tr21 is formed between the source/sinker circuit 35 and bit line BL3. A transistor Tr20 is formed between the source/sinker circuit 36 and bit line BL2. A transistor Tr19 is formed between the source/sinker circuit 36 and bit line BL3.

The source/sinker circuit 35 includes a write current source L3 and transistors Tr10 and Tr15. The current path of the transistor Tr10 has one end connected to the current source L3, and the other end connected to one end of the current path of the transistor Tr18. The current path of the transistor Tr15 has one end connected to the ground terminal, and the other end connected to one end of the current path of the transistor Tr21. A connection node between the transistors Tr10 and Tr18 and a connection node between the transistors Tr15 and Tr21 are connected.

The source/sinker circuit 36 includes a write current source L6 and transistors Tr13 and Tr16. The current path of the transistor Tr16 has one end connected to the current source L6, and the other end connected to one end of the current path of the transistor Tr20. The current path of the transistor Tr13 has one end connected to the ground terminal, and the other end connected to one end of the current path of the transistor Tr19. A connection node between the transistors Tr19 and Tr20 and a connection node between the transistors Tr13 and Tr19 are connected.

A write operation for a cell connected to the bit line BL1 will be explained below with reference to FIG. 13.

First, when writing "0", a transistor Tra connected to an MTJ element MTJa is turned on, the transistor Tr18 connected to the bit line BL1 and the transistor Tr10 of the source/sinker circuit 35 are turned on, the transistor Tr19 connected to the bit line BL3 and the transistor Tr13 of the source/sinker circuit 36 are turned on, and the transistors Tr15, Tr16, Tr20, and Tr21 are turned off. As a consequence, a write current Iw0 flows as shown in FIG. 13, and data "0" is written in the MTJ element MTJa.

On the other hand, when writing "1", the transistor Tra connected to the MTJ element MTJa is turned on, the transistor Tr18 connected to the bit line BL1 and the transistor Tr15 of the source/sinker circuit 35 are turned on, the transistor Tr19 connected to the bit line BL3 and the transistor Tr16 of the source/sinker circuit 36 are turned on, and the transistors Tr10, Tr13, Tr20, and Tr21 are turned off. Consequently, a write current Iw1 flows as shown in FIG. 13, and data "1" is written in the MTJ element MTJa.

A write operation for a cell connected to the bit line BL2 will be explained below with reference to FIG. 14.

First, when writing "0", a transistor Trb connected to an MTJ element MTJb is turned on, the transistor Tr20 connected to the bit line BL2 and the transistor Tr16 of the source/sinker circuit 36 are turned on, the transistor Tr21 connected to the bit line LS3 and the transistor Tr15 of the source/sinker circuit 35 are turned on, and the transistors Tr10, Tr13, Tr18, and Tr19 are turned off. As a consequence, the write current Iw0 flows as shown in FIG. 14, and data "0" is written in the MTJ element MTJb.

On the other hand, when writing "1", the transistor Trb connected to the MTJ element MTJb is turned on, the transistor Tr20 connected to the bit line BL2 and the transistor Tr13 of the source/sinker circuit 36 are turned on, the transistor Tr21 connected to the bit line BL3 and the transistor Tr10 of the source/sinker circuit 35 are turned on, and the transistors Tr15, Tr16, Tr18, and Tr19 are turned off. Consequently, the write current Iw1 flows as shown in FIG. 14, and data "1" is written in the MTJ element MTJb.

[4-4] Write Circuit Example 4

Figure 15:
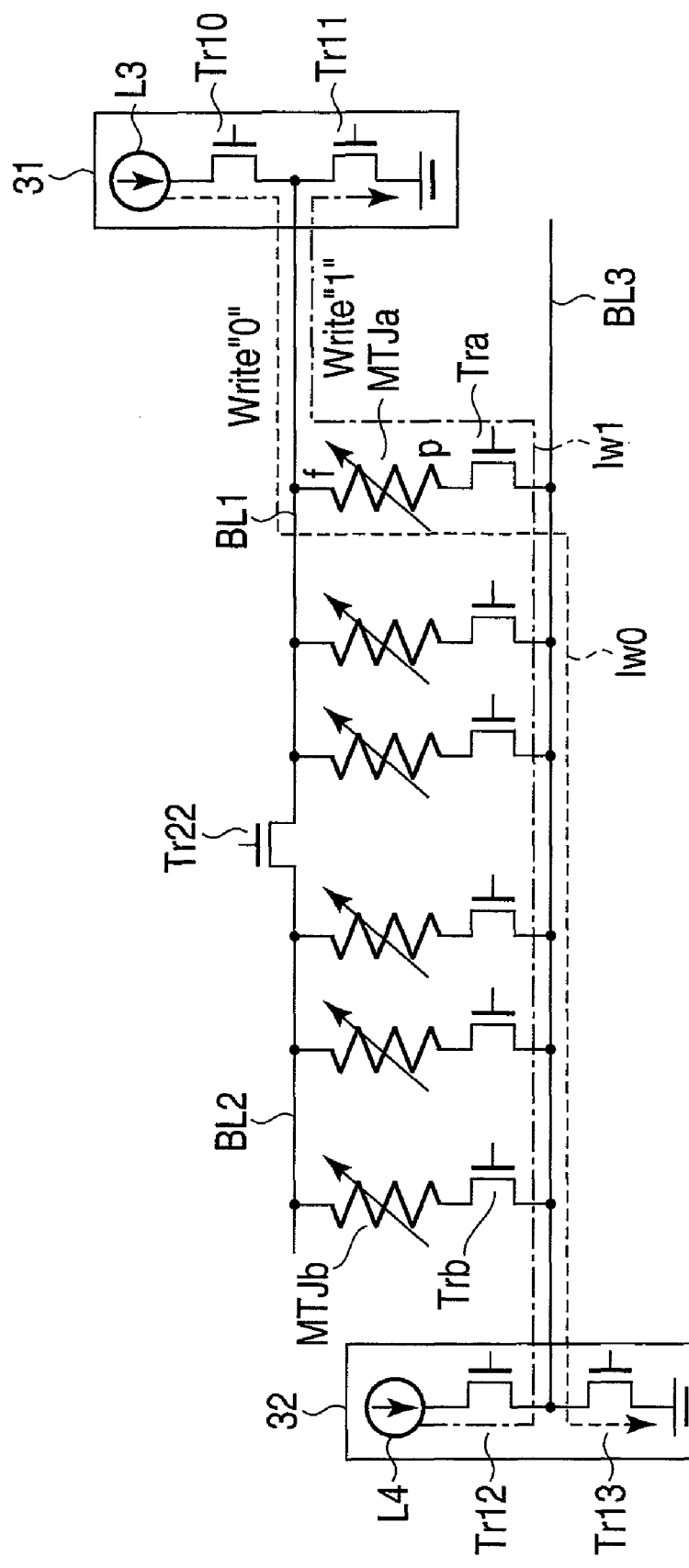
FIG. 15 is a schematic circuit diagram of write circuit example 4 of the magnetic random access memory according to the embodiment of the present invention.
Figure 16:
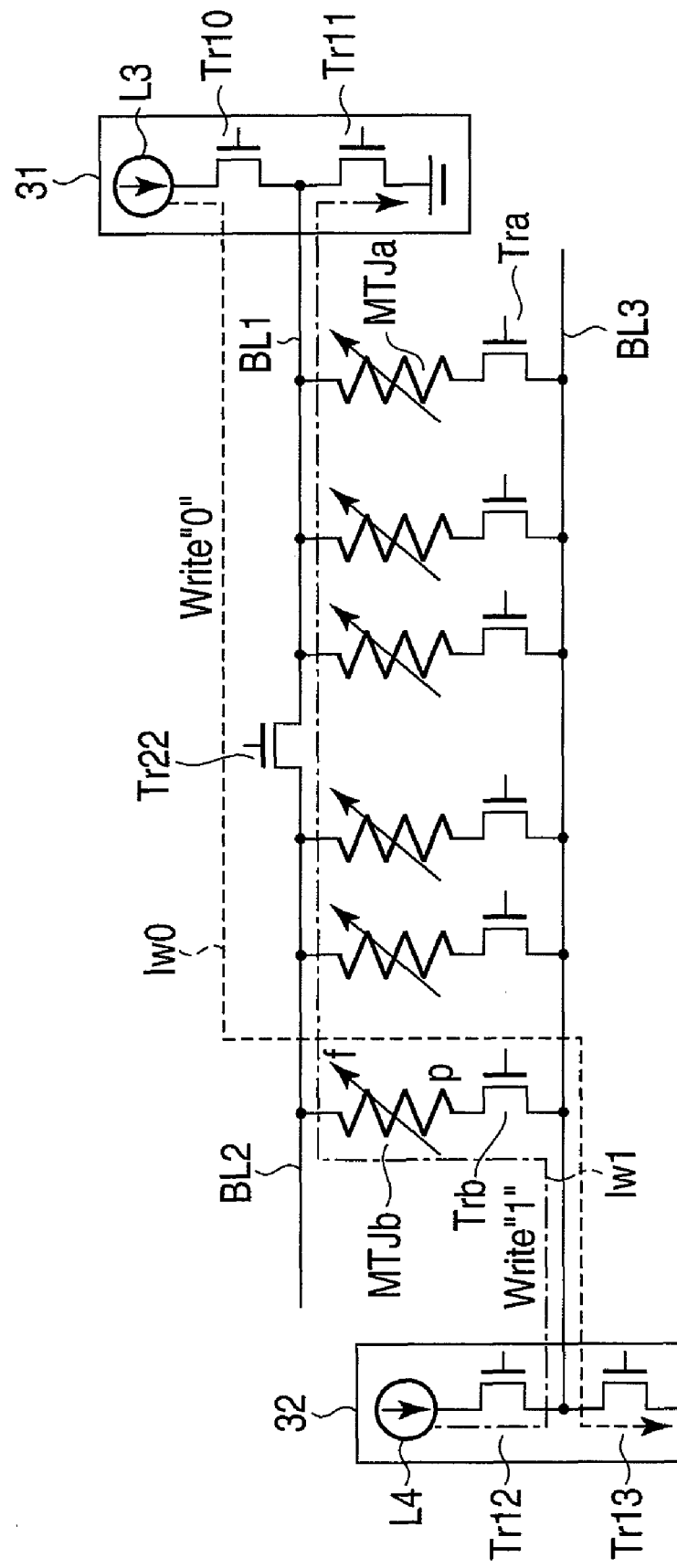
FIG. 16 is a schematic circuit diagram of write circuit example 4 of the magnetic random access memory according to the embodiment of the present invention.

FIGS. 15 and 16 are schematic circuit diagrams of write circuit example 4 of the magnetic random access memory according to the embodiment of the present invention. The circuit configuration of write circuit example 4 of this embodiment will be explained below.

Write circuit example 4 shown in FIGS. 15 and 16 is used in the case where a transistor Tr22 is formed between bit lines BL1 and BL2. An example is read circuit example 3 (FIGS. 7 and 8) described earlier. In this case, even when write object cells are attached to both the bit lines BL1 and BL2 as in write circuit example 2, a current source L3 or L4 need only be formed at one end of a corresponding one of the bit line BL1 and a bit line BL3.

A write operation for a cell connected to the bit line EL1 will be explained below with reference to FIG. 15.

First, when writing "0", a transistor Tra connected to an MTJ element MTJa is turned on, a transistor Tr10 of a source/sinker circuit 31 connected to the bit line BL1 is turned on, a transistor Tr13 of a source/sinker circuit 32 connected to the bit line BL3 is turned on, and transistors Tr11 and Tr12 and the transistor Tr22 are turned off. Consequently, a write current Iw0 flows as shown in FIG. 15, and data "0" is written in the MTJ element MTJa.

On the other hand, when writing "1", the transistor Tra connected to the MTJ element MTJa is turned on, the transistor Tr11 of the source/sinker circuit 31 connected to the bit line BL1 is turned on, the transistor Tr12 of the source/sinker circuit 32 connected to the bit line BL3 is turned on, and the transistors Tr10, Tr13, and Tr22 are turned off. As a consequence, a write current Iw1 flows as shown in FIG. 15, and data "1" is written in the MTJ element MTJa.

A write operation for a cell connected to the bit line BL12 will be explained below with reference to FIG. 16.

First, when writing "0", a transistor Trb connected to an MTJ element MTJb is turned on, the transistor Tr22 connecting the bit lines BL1 and BL2 is turned on, the transistor Tr10 of the source/sinker circuit 31 connected to the bit line BL1 is turned on, the transistor Tr13 of the source/sinker circuit 32 connected to the bit line BL3 is turned on, and the transistors Tr11 and Tr12 are turned off. As a result, the write current Iw0 flows as shown in FIG. 16, and data 11011 is written in the MTJ element MTJb.

On the other hand, when writing "1", the transistor Trb connected to the MTJ element MTJb is turned on, the transistor Tr22 connecting the bit lines BL1 and BL2 is turned on, the transistor Tr11 of the source/sinker circuit 31 connected to the bit line BL1 is turned on, the transistor Tr12 of the source/sinker circuit 32 connected to the bit line BL3 is turned on, and the transistors Tr10 and Tr13 are turned off. Consequently, the write current Iw1 flows as shown in FIG. 16, and data "1" is written in the MTJ element MTJb.

In write circuit example 4 as described above, the transistor Tr22 is turned off when reading out data from the MTJ element MTJa connected to the bit line BL1 (FIG. 15), and turned on when reading out data from the MTJ element MTJb connected to the bit line BL2 (FIG. 16).

[5] Layouts of Reference Cells

[5-1] Layouts in Bit Line Direction

Figure 19:
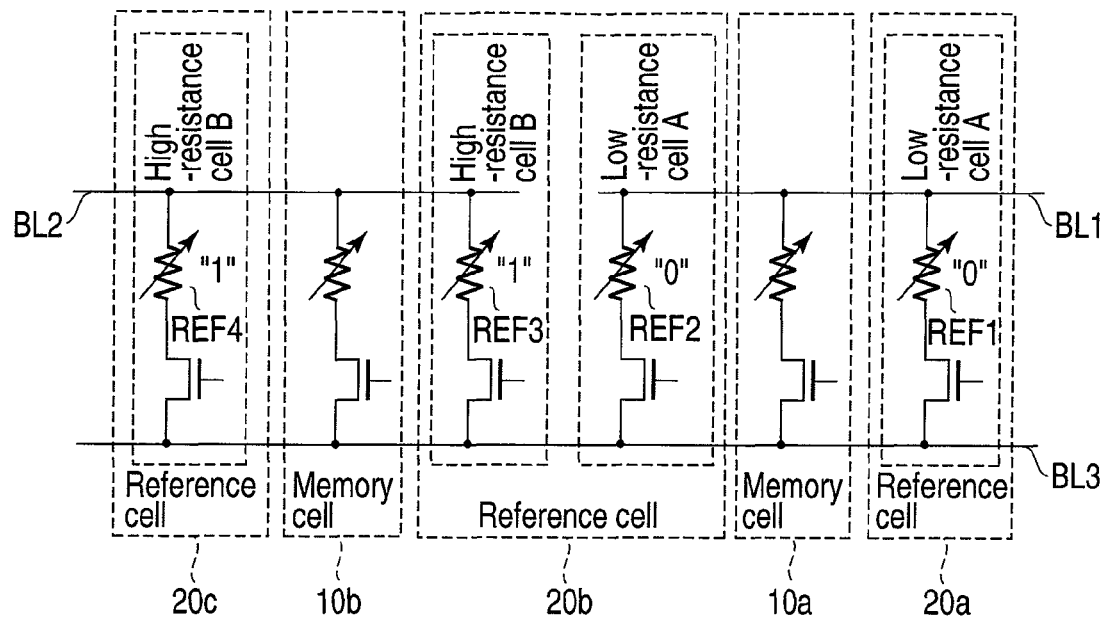
FIG. 19 is a schematic view of layout example 3 of the reference cells in the bit line direction according to the embodiment of the present invention.

FIGS. 17 to 19 are schematic views respectively showing layout examples 1 to 3 of the reference cell in the bit line direction according to the embodiment of the present invention. The layout examples of the reference cell in the bit line direction of this embodiment will be explained below.

In layout example 1 as shown in FIG. 17, cells of a reference cell 20 are collectively arranged between memory cells 10a and 10b. Accordingly, low-resistance reference elements REF1 and REF2 set in state "0" and high-resistance reference elements REF3 and REF4 set in state "1" are adjacent to each other in the direction in which bit lines BL1, BL2, and BL3 run.

In layout example 2 as shown in FIG. 18, a memory cell 10 is placed between reference cells 20a and 20b. The reference cell 20a includes low-resistance reference elements REF1 and REF2 set in state "0", and the reference cell 20b includes high-resistance reference elements REF3 and REF4 set in state "1".

In layout example 3 as shown in FIG. 19, a memory cell 10a is placed between reference cells 20a and 20b, and a memory cell 10b is placed between the reference cell 20b and a reference cell 20c. Those cells of the reference cells 20a and 20b, which are connected to the bit line BL1 are low-resistance reference elements REF1 and REF2 set in state "0". Those cells of the reference cells 20b and 20c, which are connected to the bit line BL2 are high-resistance reference elements REF3 and REF4 set in state "1".

Note that the three layout examples are explained above, but the present invention is not limited to these examples. That is, the layout of the memory cells and reference cells can be variously changed, provided that all reference cells connected to the bit line BL1 are set in the same first resistance state ("0" or "1"), and all reference cells connected to the bit line BL2 are set in the second resistance state ("1" or "0").

[5-2] Layouts in Word Line Direction

Figure 20:
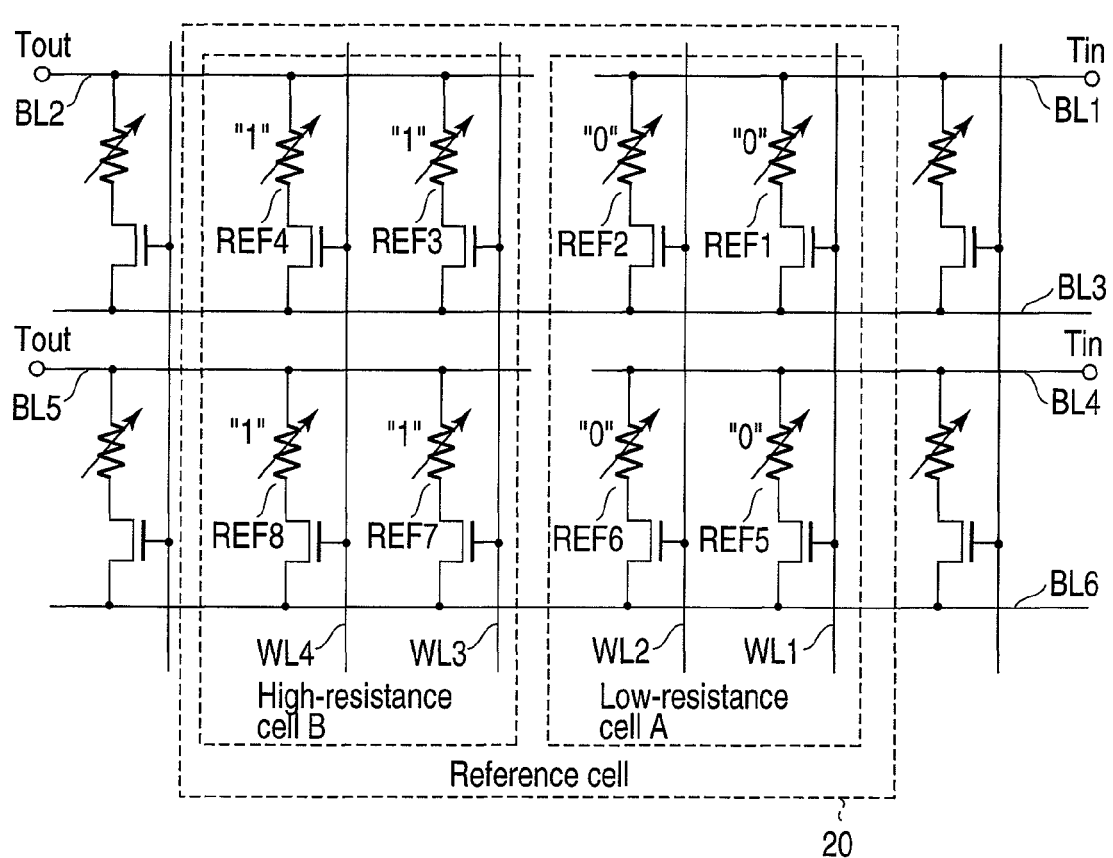
FIG. 20 is a schematic view of layout example 1 of the reference cell in the word line direction according to the embodiment of the present invention.

FIGS. 20 and 21 are schematic views of layout examples 1 and 2 of the reference cell in the word line direction according to the embodiment of the present invention. The layout examples of the reference cell in the word line direction of this embodiment will be explained below.

In layout example 1 as shown in FIG. 20, the resistance states of a plurality of reference elements connected to one word line are the same. For example, reference elements REF1 and REF5 connected to a common word line WL1 are set in the same state "0", and reference elements REF3 and REF7 connected to a common word line WL3 are set in the same state "1".

In layout example 2 as shown in FIG. 21, the resistance states of a plurality of reference elements connected to one word line are different. For example, of reference elements REF1 and REF5 connected to a common word line WL1, the reference element REF1 is set in state "0", whereas the reference element REF5 is set in state "1". Also, of reference elements REF3 and REF7 connected to a common word line WL3, the reference element REF3 is set in state "1", whereas the reference element REF7 is set in state "0".

In layout example 2 shown in FIG. 21, input terminals Tin are attached to bit lines BL1 and BL4, and output terminals Tout are attached to bit lines BL2 and BL5. Accordingly, a read current can be supplied to each reference element in the same direction as the write direction of the resistance state written in the element, as in layout example 1 shown in FIG. 20.

Note that it is also possible to combine the reference cells 20 shown in FIGS. 20 and 21. For example, it is possible to lay out the reference cell 20 shown in FIG. 20 below the reference cell 20 shown in FIG. 21 on the drawing surface, and further lay out the reference cell 20 shown in FIG. 21 below the reference cell 20 shown in FIG. 20. In this layout, the resistance states of reference elements connected to the word line WL1 are "0", "1", "0", "0", "0", and "1".

[6] Positional Relationships between MTJ Elements and Transistors

The above embodiment has been explained by taking the case where the pinned layer p of the MTJ element is connected to the selection transistor as an example. However, the free layer f of the MTJ element may also be connected to the selection transistor by modifying the circuit layout.

That is, between the sense amplifier S/A and ground terminal shown in, e.g., FIG. 1, the low-resistance cell A in which data "0" is written is placed on the sense amplifier S/A side, and the high-resistance cell B in which data "1" is written is placed on the ground terminal side. Between a sense amplifier S/A and ground terminal shown in FIG. 22, however, a high-resistance cell B in which data "1" is written is placed on the sensor amplifier S/A side, and a low-resistance cell A in which data "0" is written is placed on the ground terminal side.

Figure 22:
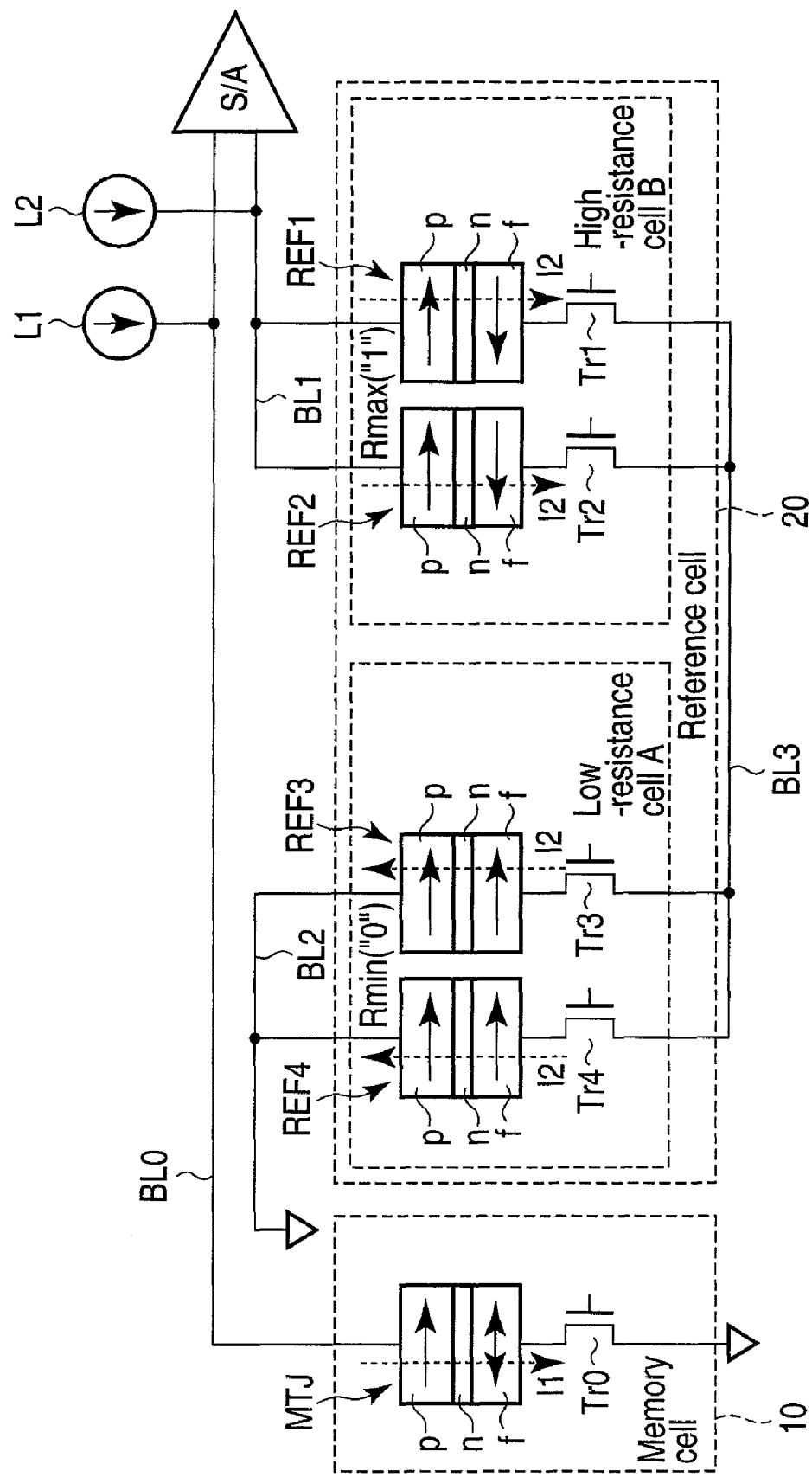
FIG. 22 is an exemplary view when a free layer is connected to a selection transistor in the magnetic random access memory according to the embodiment of the present invention.

More specifically, as shown in FIG. 22, reference elements REF1 and REF2 are set in the high-resistance state Rmax in which data "1" is written. On the other hand, reference elements REF3 and REF4 are set in the low-resistance state Rmin in which data "0" is written. The fixed layers p of the reference elements REF1 and REF2 are connected to the sense amplifier S/A via a bit line BL1. The fixed layers p of the reference elements REF3 and REF4 are connected to the ground terminal via a bit line BL2. The free layer f of each of the reference elements REF1, REF2, REF3, and REF4 is connected to one end of the current path of a corresponding one of transistors Tr1, Tr2, Tr3, and Tr4. The other end of the current path of each of the transistors Tr1, Tr2, Tr3, and Tr4 is connected to a bit line BL3.

When a read operation is performed in the configuration as described above, a read current I2 flows in the same direction as the "1" write direction, i.e., from the pinned layer p to the free layer f in each of the reference elements REF1 and REF2 in which data "1" is set, and flows in the same direction as the "0" write direction, i.e., from the free layer f to the pinned layer p in each of the reference elements REF3 and REF4 in which data "0" is set.

[7] Effects

In the embodiment of the present invention, the reference elements REF1 and REF2 in which the same data (e.g., data "0") is written are connected to the first bit line BL1, the reference elements REF3 and REF4 in which the opposite data (e.g., data "1") is written are connected to the second bit line BL2, and the reference elements REF1 and REF2 are connected to the reference elements REF3 and REF4 by the third bit line BL3. Accordingly, a compact circuit having only one data column can generate the middle resistance (Rmax+Rmin)/2 as a reference signal for data read, on the basis of the reference elements REF1, REF2, REF3, and REF4 preset in data "0" and "1". This makes it possible to ensure a large read margin without forming any special space for reference cells.

Also, in the conventional MRAM as described previously, connecting a reference cell having the high resistance Rmax and a reference cell having the low resistance Rmin in series requires a special structure in only the reference cell portion. In this embodiment, however, the reference cell 20 can have the same structure as that of the memory cell 10. This simplifies the fabrication process and circuit configuration. In addition, the occupied area of the cell array can be reduced because no extra space for an interconnection of the reference cell is necessary.

Furthermore, in the reference cell 20 of this embodiment, the reference cell having the high resistance Rmax and the reference cell having the low resistance Rmin are not simply connected in series (or parallel), unlike in the conventional MRAM. After the memory cell is completed, therefore, electric currents can be supplied from the both sides of the reference elements REF1, REF2, REF3, and REF4, so data of the reference elements REF1, REF2, REF3, and REF4 can be freely overwritten. This makes it possible to increase the degree of freedom of data setting of the reference elements REF1, REF2, REF3, and REF4.

Assume that the direction of an electric current flowing from the MTJ element (reference element) to the selection transistor Tr is the "0" write direction, and the direction of an electric current flowing from the selection transistor Tr to the MTJ element (reference element) is the "1" write direction. In this case, if data "0" is written in the reference elements REF1 and REF2 connected to the first bit line BL1 and data "1" is written in the reference elements REF3 and REF4 connected to the second bit line BL2, the direction of an electric current flowing through each of the reference elements REF1, REF2, REF3, and REF4 matches the write direction corresponding to the data prewritten in the element. Consequently, the probability of the occurrence of read disturb can be decreased.

Note that in the above embodiment, the resistance-change memory has been explained by taking a spin transfer torque writing type MRAM having a magneto resistive effect element as an example. However, the present invention is not limited to this memory. For example, the present invention is applicable to a PRAM using a chalcogenide element, or an ReRAM using a transition metal oxide element.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A resistance-change memory comprising:
a first bit line and a second bit line extending in the same direction;
a third bit line extending parallel to the first bit line and the second bit line;
a fourth bit line and a fifth bit line extending in the same direction;
a sixth bit line extending parallel to the fourth bit line and the fifth bit line;
a first memory element which comprises a first terminal connected to the first bit line and a second terminal connected to the third bit line, and is configured to change to either a first resistance state or a second resistance state;
a first reference element comprising a first terminal connected to the fourth bit line and a second terminal connected to the sixth bit line, the first reference element being set in the first resistance state;
a second reference element making a pair with the first reference element, comprising a first terminal connected to the fifth bit line and a second terminal connected to the sixth bit line, the second reference element being set in the second resistance state; and
a sense amplifier comprising a first input terminal connected to the first bit line and a second input terminal connected to the fourth bit line,
wherein the resistance-change memory is configured such that a first read current flows from the fourth bit line through the first reference element, then through the sixth bit line, and then through the second reference element to the fifth bit line while reading out data from the first memory element.

2. The memory of claim 1, wherein the first read current is supplied in a first direction to set the first reference element in the first resistance state, and in a second direction to set the second reference element in the second resistance state, while reading out data from the first memory element.

3. The memory of claim 1, wherein
the first memory element, the first reference element, and the second reference element comprise magneto resistive effect elements,
the first memory element comprises a first pinned layer in which a magnetization direction is fixed, a first free layer in which a magnetization direction changes in accordance with a direction of a write current, and a first nonmagnetic layer disposed between the first pinned layer and the first free layer,
the first reference element comprises a second pinned layer in which a magnetization direction is fixed, a second free layer in which a magnetization direction changes in accordance with a direction of a write current, and a second nonmagnetic layer disposed between the second pinned layer and the second free layer, and
the second reference element comprises a third pinned layer in which a magnetization direction is fixed, a third free layer in which a magnetization direction changes in accordance with a direction of a write current, and a third nonmagnetic layer disposed between the third pinned layer and the third free layer.

4. The memory of claim 3, which further comprises:
a first transistor comprising a first current path comprising a first end connected to the first pinned layer;
a second transistor comprising a second current path comprising a first end connected to the second pinned layer;
a third transistor comprising a third current path comprising a first end connected to the third pinned layer;

a first current source connected to the first bit line;
a second current source connected to the fourth bit line; and
a ground terminal connected to a second end of the first current path and the third free layer, wherein
magnetization directions in the second pinned layer and the second free layer are set parallel to each other in the memory,
magnetization directions in the third pinned layer and the third free layer are set antiparallel to each other in the memory, and
a second end of the second current path and a second end of the third current path are connected via the sixth bit line.

5. The memory of claim 1, wherein the fourth bit line and the fifth bit line are on the same straight line.

6. The memory of claim 1, wherein
the first reference element comprises a plurality of first reference sub-elements, and the plurality of first reference sub-elements are connected in parallel by the fourth bit line and the sixth bit line,
the second reference element comprises a plurality of second reference sub-elements, and the plurality of second reference sub-elements are connected in parallel by the fifth bit line and the sixth bit line,
the plurality of first reference sub-elements connected to the fourth bit line are set in the first resistance state, and
the plurality of second reference sub-elements connected to the fifth bit line are set in the second resistance state.

7. The memory of claim 1, further comprising:
a second memory element which comprises a first terminal connected to the fourth bit line and a second terminal connected to the sixth bit line, and is configured to change to either the first resistance state or the second resistance state;
a third reference element comprising a first terminal connected to the first bit line and a second terminal connected to the third bit line, the third reference element being set in the first resistance state; and
a fourth reference element making a pair with the third reference element, comprising a first terminal connected to the second bit line and a second terminal connected to the third bit line, the fourth reference element being set in the second resistance state.

8. The memory of claim 1, further comprising a second memory element which comprises a first terminal connected to the second bit line and a second terminal connected to the third bit line, and is configured to change to either the first resistance state or the second resistance state.

9. The memory of claim 8, further comprising a first transistor comprising a first current path comprising a first end connected to the first bit line and a second end connected to the second bit line, wherein
the first transistor is turned off while reading out data from the first memory element, and is turned on while reading out data from the second memory element.

10. The memory of claim 9, further comprising a second transistor comprising a second current path comprising a first end connected to the fourth bit line and a second end connected to the fifth bit line, wherein
the second transistor is turned off if the first reference element and the second reference element are used to generate a reference potential while reading out data from either the first memory element or the second memory element.

11. The memory of claim 1 further comprising:
a seventh bit line and an eighth bit line extending in the same direction;
a ninth bit line extending parallel to the seventh bit line and the eighth bit line;
a third reference element comprising a first terminal connected to the seventh bit line and a second terminal connected to the ninth bit line, the third reference element being set in the first resistance state; and
a fourth reference element making a pair with the third reference element, comprising a first terminal connected to the eighth bit line and a second terminal connected to the ninth bit line, the fourth reference element being set in the second resistance state, wherein
the first reference element, the second reference element, the third reference element, and the fourth reference element are used to generate a reference potential, and
wherein the resistance-change memory is configured such that a second read current flows from the seventh bit line through the third reference element, then through the eighth bit line, and then through the fourth reference element to the ninth bit line while reading out data from the first memory element.

12. The memory of claim 11, further comprising:
a first transistor comprising a first current path comprising a first end connected to the first reference element and a second end connected to the sixth bit line;
a second transistor comprising a second current path comprising a first end connected to the second reference element and a second end connected to the sixth bit line;
a third transistor comprising a third current path comprising a first end connected to the third reference element and a second end connected to the ninth bit line;
a fourth transistor comprising a fourth current path comprising a first end connected to the fourth reference element and a second end connected to the ninth bit line;
a first word line connected to gates of the first transistor and the third transistor;
a second word line connected to gates of the second transistor and the fourth transistor.

13. The memory of claim 11, wherein the fourth bit line and the seventh bit line are connected, and the fifth bit line and the eighth bit line are connected.

14. The memory of claim 1, further comprising:
a first source and sink circuit for writing data connected to a first end of either the first bit line or the second bit line; and
a second source and sink circuit for writing data connected to a first end of the third bit line.

15. The memory of claim 1, which further comprises:
a second memory element which comprises a first terminal connected to the second bit line and a second terminal connected to the third bit line, and is configured to change to either the first resistance state or the second resistance state;
a third reference element comprising a first terminal connected to the first bit line and a second terminal connected to the third bit line, the third reference element being set in the first resistance state;
a fourth reference element making a pair with the third reference element, comprising a first terminal connected to the second bit line and a second terminal connected to the third bit line, the fourth reference element being set in the second resistance state;
a first source and sink circuit for writing data connected to a first end of the first bit line;
a second source and sink circuit for writing data connected to a first end of the third bit line;
a third source and sink circuit for writing data connected to a second end of the third bit line; and a fourth source and sink circuit for writing data connected to a first end of the second bit line, wherein the first source and sink circuit and either the second source and sink circuit or the third source and sink circuit are used while writing data in either the first memory element or the third reference element, and the fourth source and sink circuit and either the second source and sink circuit or the third source and sink circuit are used while writing data in either the second memory element or the fourth reference element.

16. The memory of claim 1, further comprising:

a second memory element which comprises a first terminal connected to the second bit line and a second terminal connected to the third bit line, and is configured to change to either the first resistance state or the second resistance state;

a third reference element comprising a first terminal connected to the first bit line and a second terminal connected to the third bit line, the third reference element being set in the first resistance state;

a fourth reference element making a pair with the third reference element, comprising a first terminal connected to the second bit line and a second terminal connected to the third bit line, the fourth reference element being set in the second resistance state;

a first source and sink circuit for writing data connected to a first end of the first bit line and a first end of the third bit line;

a second source and sink circuit for writing data connected to a first end of the second bit line and a second end of the third bit line;

a first transistor formed between the first source and sink circuit and a first end of the first bit line;

a second transistor formed between the first source and sink circuit and a first end of the third bit line;

a third transistor formed between the second source and sink circuit and a first end of the second bit line; and a fourth transistor formed between the second source and sink circuit and a second end of the third bit line, wherein the first source and sink circuit and the second source and sink circuit are used by turning on the first transistor and the fourth transistor while writing data in either the first memory element or the third reference element, and the first source and sink circuit and the second source and sink circuit are used by turning on the second transistor and the third transistor while writing data in either the second memory element or the fourth reference element.

17. The memory of claim 1, which further comprises:

a second memory element which comprises a first terminal connected to the second bit line and a second terminal connected to the third bit line, and is configured to change to either the first resistance state or the second resistance state;

a third reference element comprising a first terminal connected to the first bit line and a second terminal connected to the third bit line, and set in the first resistance state;

a fourth reference element making a pair with the third reference element, comprising a first terminal connected to the second bit line and a second terminal connected to the third bit line, and set in the second resistance state;

a first source and sink circuit for writing data connected to a first end of the first bit line;

a second source and sink circuit for writing data connected to a first end of the third bit line; and a transistor comprising a current path comprising a first end connected to a second end of the first bit line, and a second end connected to a first end of the second bit line, wherein the first source and sink circuit and the second source and sink circuit are used by turning off the transistor while writing data in either the first memory element or the third reference element, and the first source and sink circuit and the second source and sink circuit are used by turning on the transistor while writing data in either the second memory element or the fourth reference element.

18. The memory of claim 1, wherein the first reference element and the second reference element are next to each other in a direction parallel to the first bit line, the second bit line, and the third bit line.

19. The memory of claim 1, wherein the first memory element is placed between the first reference element and the second reference element.

20. The memory of claim 1, further comprising:

a seventh bit line and an eighth bit line extending in the same direction;

a ninth bit line extending parallel to the seventh bit line and the eighth bit line;

a third reference element comprising a first terminal connected to the seventh bit line and a second terminal connected to the ninth bit line, the third reference element being set in the second resistance state;

a fourth reference element making a pair with the third reference element, comprising a first terminal connected to the eighth bit line and a second terminal connected to the ninth bit line, the fourth reference element being set in the first resistance state;

a first transistor connected in series with the first reference element;

a second transistor connected in series with the second reference element;

a third transistor connected in series with the third reference element;

a fourth transistor connected in series with the fourth reference element;

a first word line connected to gates of the first transistor and the third transistor; and a second word line connected to gates of the second transistor and the fourth transistor.

* * * * *